US012746636B2

(12) United States Patent
Hou et al.

(10) Patent No.: US 12,746,636 B2
(45) Date of Patent: Sep. 29, 2026

(54) APPARATUS AND METHODS FOR CHEMICAL MECHANICAL POLISHING

(71) Applicant: TAIWAN SEMICONDUCTOR MANUFACTURING COMPANY, LTD., Hsinchu (TW)

(72) Inventors: Te-Chien Hou, Kaohsiung (TW); Chih Hung Chen, Hsinchu (TW); Kang Huang, Hsinchu (TW); Wen-Pin Liao, Hsinchu (TW); Shich-Chang Suen, Tainan (TW); Kei-Wei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 85 days.

(21) Appl. No.: 18/789,745

(22) Filed: Jul. 31, 2024

(65) Prior Publication Data

US 2024/0383093 A1 Nov. 21, 2024

Related U.S. Application Data

(62) Division of application No. 17/751,851, filed on May 24, 2022, now Pat. No. 12,447,580.

(51) Int. Cl.
*B24B 37/04* (2012.01)
*B24B 7/06* (2006.01)
(Continued)

(52) U.S. Cl.
CPC .............. *B24B 37/042* (2013.01); *B24B 7/06* (2013.01); *B24B 37/11* (2013.01); *B24B 37/30* (2013.01);
(Continued)

(58) Field of Classification Search
None
See application file for complete search history.

(56) References Cited

U.S. PATENT DOCUMENTS

2004/0134513 A1* 7/2004 Lu ............................ B08B 3/12 134/1
2006/0035797 A1* 2/2006 Tomita ..................... C11D 7/08 134/28
(Continued)

FOREIGN PATENT DOCUMENTS

WO WO-9951398 A1 * 10/1999 ............. B24B 57/02

*Primary Examiner* — Kaj K Olsen
*Assistant Examiner* — Pradhuman Parihar
(74) *Attorney, Agent, or Firm* — NZ Carr Law Office

(57) ABSTRACT

Embodiments of the present disclosure relate a CMP tool and methods for planarization a substrate. Particularly, embodiments of the present disclosure provide a substrate transporter for use in a CMP tool. The transporter may be used transport and/or carry substrates among various polishers and cleaners in a CMP tool while preventing the substrates from drying out during transportation. By keeping surfaces of the substrates wet during substrate waiting time or idle time in the CMP tool, embodiments of the present disclosure prevent many types of defects, such as byproducts, agglomerated abrasives, pad debris, slurry residues, from accumulate on the substrate surface during CMP processing, thus improve yields and device performance.

20 Claims, 26 Drawing Sheets

(51) Int. Cl.
*B24B 37/11* (2012.01)
*B24B 37/30* (2012.01)
*H10P 72/00* (2026.01)
*H10P 72/30* (2026.01)

(52) U.S. Cl.
CPC .......... *H10P 72/0416* (2026.01); *H10P 72/32* (2026.01)

(56) References Cited

U.S. PATENT DOCUMENTS

2017/0323807 A1* 11/2017 Kweon ............. H01L 21/67288
2018/0056479 A1* 3/2018 Hu .......................... B24B 41/02
2019/0115230 A1* 4/2019 Toyomura ............. H01L 21/683

* cited by examiner

APPARATUS AND METHODS FOR CHEMICAL MECHANICAL POLISHING

CROSS-REFERENCE TO RELATED APPLICATIONS

This application is a Divisional application of U.S. patent application Ser. No. 17/751,851, filed May 24, 2022, which is incorporated by reference in its entirety.

BACKGROUND

During the manufacture of integrated circuits (ICs), multi-step sequences of semiconductor manufacturing processes are performed to gradually form electronic circuits on semiconductor substrates. One such semiconductor manufacturing process is chemical mechanical polishing (CMP). CMP is a process for smoothing or planarizing surfaces using a combination of chemical and mechanical forces. Among other things, CMP advantageously allows features of the electronic circuits to be more precisely formed.

As the device dimension scales down, byproducts, agglomerated abrasives, pad debris, slurry residues, and other particles on the substrate surface during related CMP process may cause higher level of defects, reducing product yield rate. Therefore, there is a need to improve CMP process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
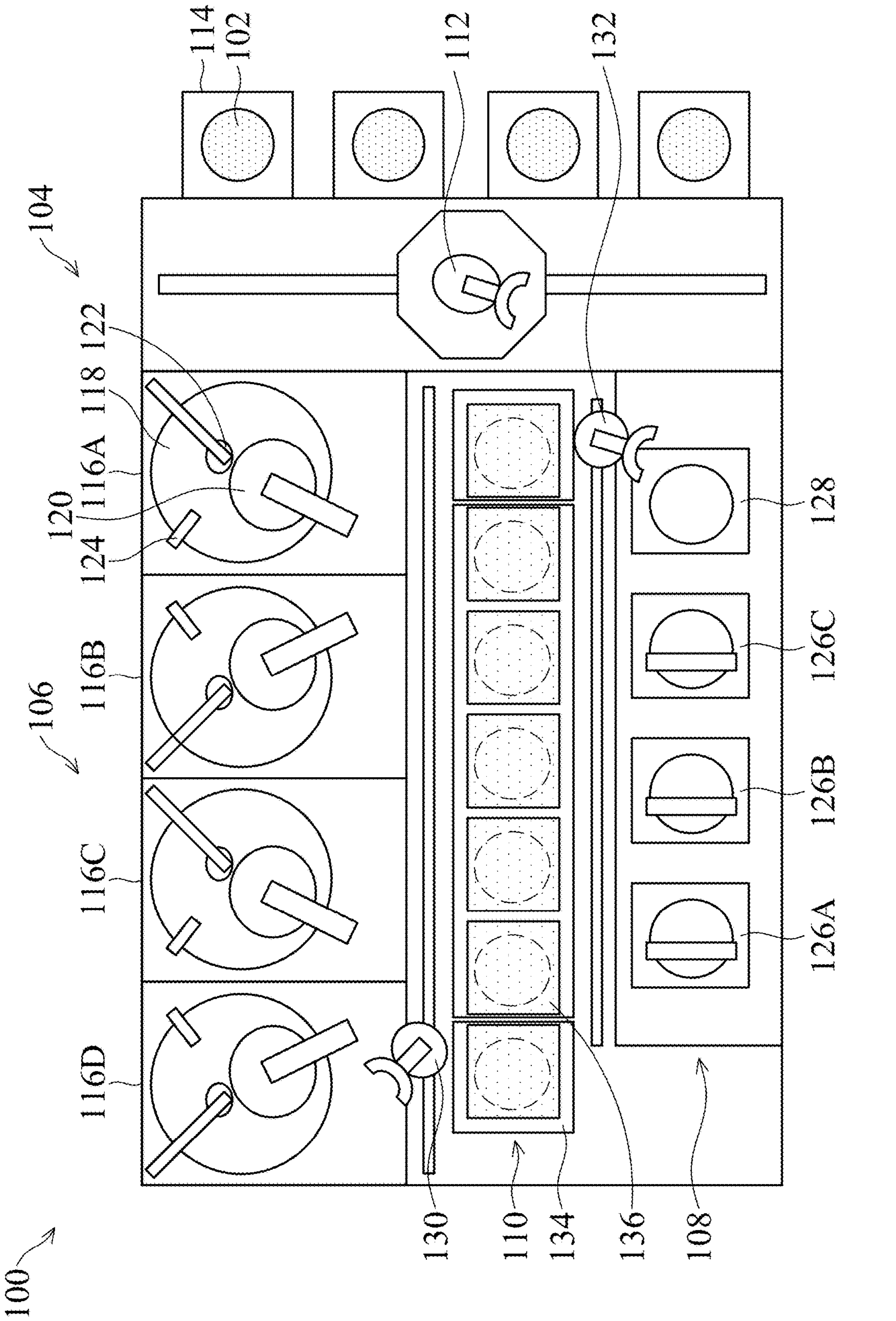
FIG. 1A is a schematic block diagram of a CMP tool in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure relate a CMP tool and methods for planarization a substrate. Particularly, embodiments of the present disclosure provide a substrate transporter for use in a CMP tool. The transporter may be used transport and/or carry substrates among various polishers and cleaners in a CMP tool while preventing the substrates from drying out during transportation. By keeping surfaces of the substrates wet during substrate waiting time or idle time in the CMP tool, embodiments of the present disclosure prevent many types of defects, such as byproducts, agglomerated abrasives, pad debris, slurry residues, from accumulate on the substrate surface during CMP processing, thus improve yields and device performance.

Figure 1B:
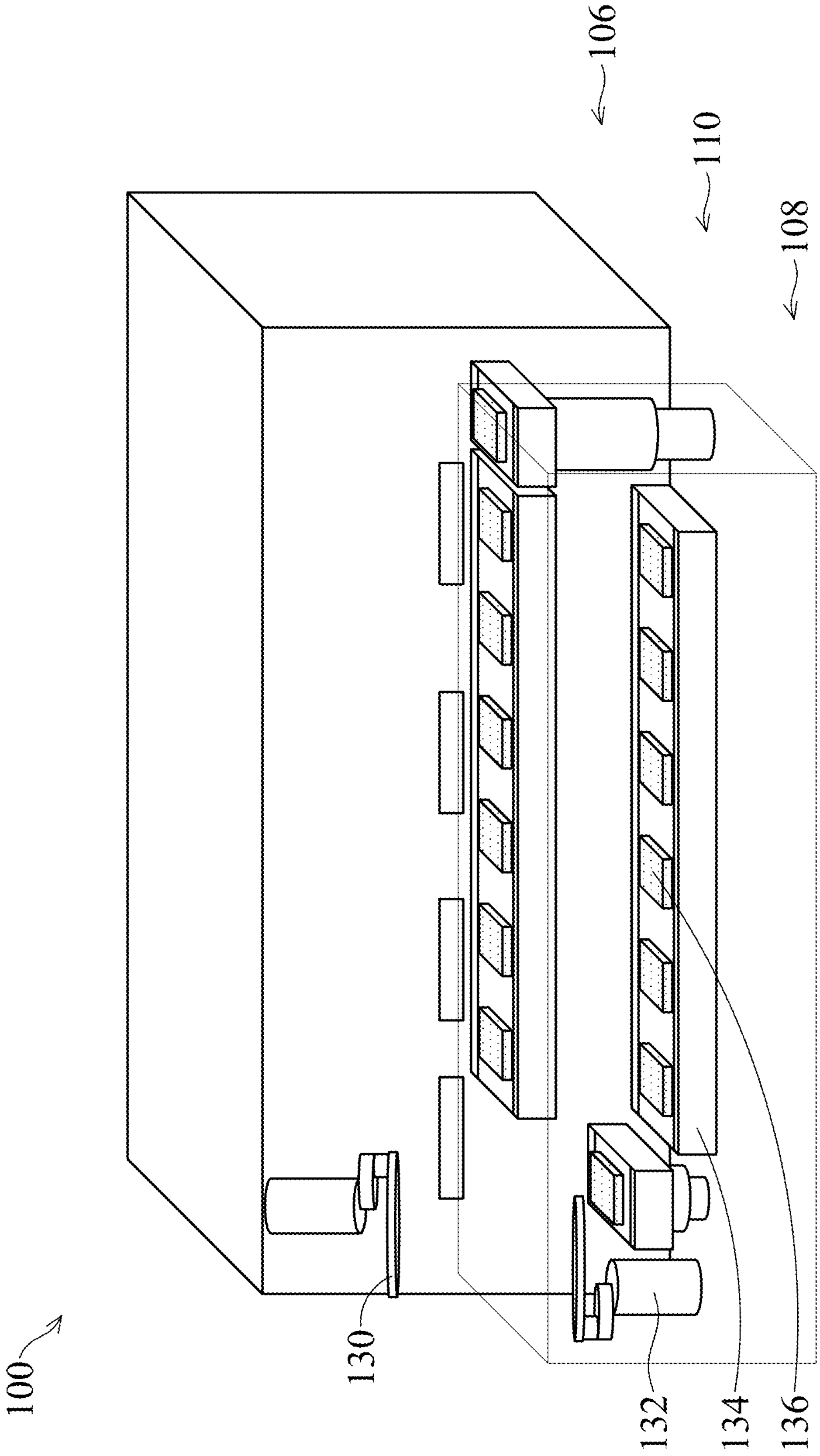
FIG. 1B is a schematic partial perspective view of the CMP tool of FIG. 1A.
Figure 1C:
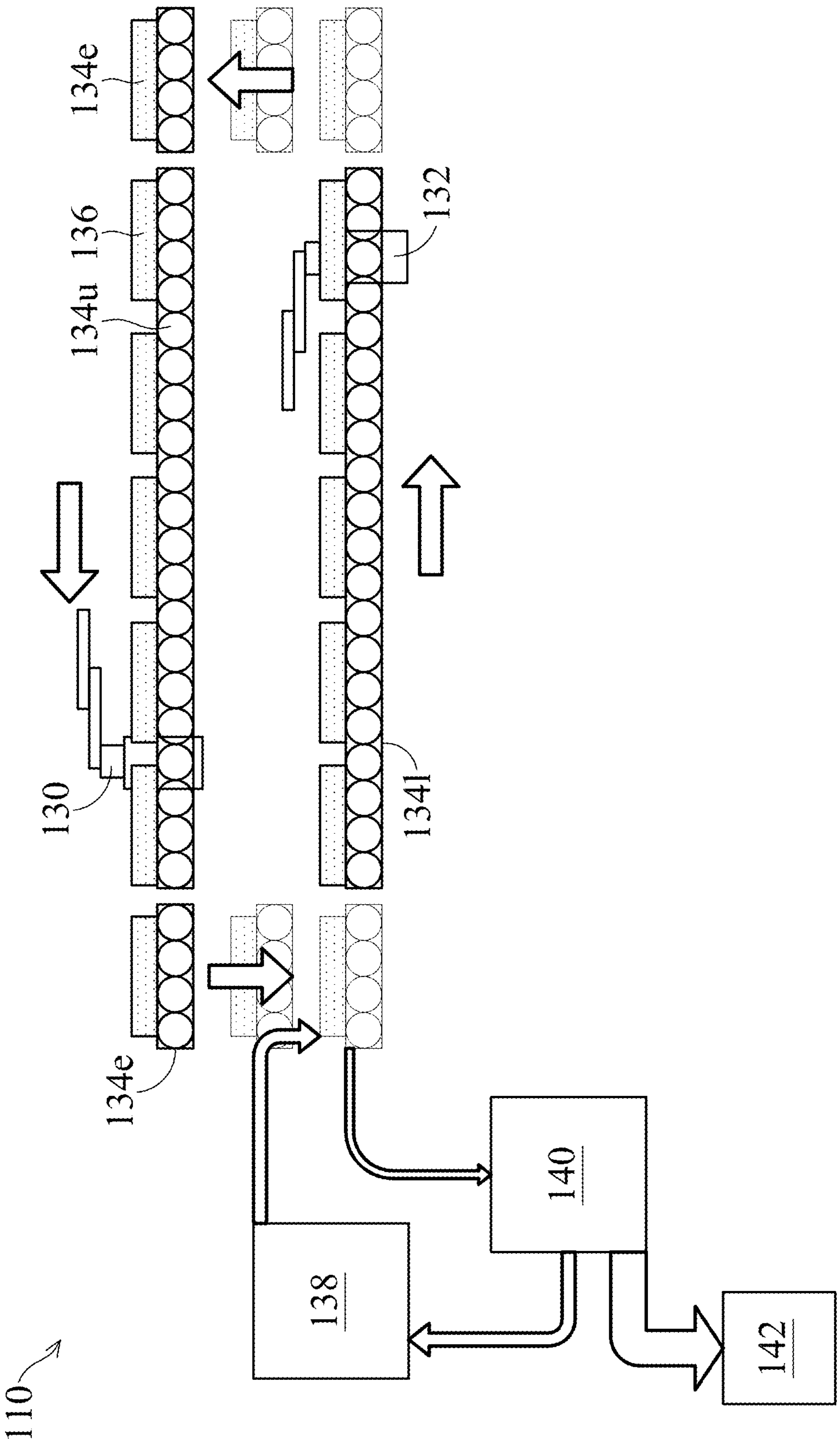
FIG. 1C is a schematic view of side view of a substrate transporter in the CMP tool of FIG. 1A.

FIG. 1A is a schematic block diagram of a CMP tool 100 in accordance with some embodiments of the present disclosure. FIG. 1B is a schematic partial perspective view of the CMP tool 100 of FIG. 1A. FIG. 1C is a schematic view of side view of a transfer module in the CMP tool 100 of FIG. 1A.

The CMP tool 100 is configured for processing a plurality of substrates 102. In some embodiments, the CMP tool 100 includes a factory interface 104, a polishing module 106, a cleaning module 108, and a transfer module 110. In some embodiments, the CMP tool 100 may further includes a controller to facilitate control of the planarizing, cleaning, and transfer processes.

The factory interface 104 generally includes an interface robot 112. One or more front opening unified pods (FOUPs) 114 may be attached to the factory interface 104. The interface robot 112 may be configured to transfer substrates to be processed from the one or more FOUPs 114 to the polishing module 106 and from the cleaning module 108 to the one or more FOUPs 114. In some embodiments, the factory interface 104 may include two interface robots 112, one for handling substrates prior to being processed in the CMP tool 100, and the other for handling substrates after being processed in the CMP tool 100, to reduce cross contamination via substrate handling robots.

The polishing module 106 may include one or more polishing stations 116, each configured to perform a particular polishing operation. Each polishing station 116 may include a platen 118, a carrier head 120, a pad conditioner 122, and a slurry nozzle 124.

The platen 118 includes a rotatable table covered by a polishing pad (not shown) having a polishing surface. In some embodiments, the polishing pad may be adhered to the platen 118 through vacuum force. The platen 118 can be provided with a series of distributed holes operatively connected to a vacuum system allowing the polishing pad to be subjected to an appropriate vacuum. The level of vacuum can be monitored and/or controlled using conventional pressure monitors and fixtures to uniformly distribute the vacuum along the underside of the polishing pad and adhere the pad to the platen 118 thereby resulting in a controlled flatness of the respective polishing surface. Exemplary polishing pads can be comprised of cast or sliced polyurethane, polyurethane impregnated polyester felt, or another suitable material.

The carrier head 120 is configured to retain a substrate 102 facing down towards the platen 118 to be polished. In some embodiments, the carrier head 120 stays within a polishing station 116. In other embodiments, the carrier head 120 is adapted to accept substrates from and return substrate to a substrate transfer robot in the CMP tool 100. A substrate 102 may be held by vacuum to the carrier head 120 or held thereto by a backing film. In some embodiments, the substrate 102 is encompassed by a retainer ring attached to the carrier head 120. During polishing, the carrier head 120 may rotate the substrate about a central axis.

In some embodiments, as shown in FIG. 1A, the carrier head 120 may be connected to a frame of the polishing station 116 by a pivot arm, which allows the carrier head 120 to move relative to the platen 118. In some embodiments, the carrier head 120 is adaptable to accept substrates from and return substrates to a load cup positioned on the polishing station 116. The carrier head 120 may pivot about the pivot arm between a polishing position and a substrate loading/unloading position. During polishing, the carrier head 120 may also swing back and forth relative to the platen 118 to enable a uniform polishing rate across the substrate surface. In other embodiments, two or more carrier heads 120 may be attached to a carousel and moves relative to two or more platens 118.

The slurry nozzle 124 is configured to introduce a polishing slurry to the polishing pad on the platen 118. The polishing slurry may include abrasive particles and chemicals to enable chemical mechanical polishing process. Exemplary slurries may comprise abrasive particles suspended in an alkaline, neutral or acidic solution, depending upon the process requirement, i.e., chemical etchants and colloid particles. In some embodiments, the polishing slurry may include one or more chemicals such as oxidizing agents, chelating agents, corrosion inhibitors, stabilizing agents, and/or pH adjusting agents. Designs of the polishing pad and composition of the slurry are selected according to handle different polishing tasks, such as wafers with different material composition to be removed, amount of material to be removed, etc.

The pad conditioner 122 is configured to prepare and condition the surface of the polishing pad on the platen 118 during, before and/or after CMP processes. The pad conditioner 122 may include a conditioner head attached to a pivot arm.

During polishing, the platen 118 and the carrier head 120 are rotated about different axis to remove material and even out irregular topographies on the substrate. In some embodiments, the carrier head 120 may also swing related to the platen 118. The rotating carrier head 120 presses the substrate 102 against the rotating polishing pad on the platen 118, and slurry containing chemical etchants and colloid particles are introduced using the slurry nozzle 124 onto the polishing pad. Through this active rotation of a substrate 102 on a polishing pad on the platen 118 under pressure in a presence of a polishing medium, irregularities on the wafer surface are removed during one or more CMP processes thereby resulting in a planarization of the substrate 102.

The polishing module 106 may include two or more polishing stations 116. In some embodiments, different polishing stations 116 may be configured with different polishing pads and/or supplied with different polishing slurries to achieve different polishing tasks, for example, rough polishing, fine polishing, and puffing.

The polishing module 106 may be provided with any number of polishing stations 116. In some embodiments, all of the polishing stations 116 are configured to perform a same processing task on different substrates 102. In other embodiments, the polishing stations 116 are configured independently to allow different processing tasks to be performed on different substrates 102 at the same time, for example to achieve various polishing steps in a CMP operation. For example, in a CMP operation includes two polishing steps, a rough polish and a fine polish, the polishing module 106 may include a first polishing station configured to perform the rough polish and a second polishing station configured to perform the fine polish. In some embodiments, the polishing module 106 may include two or more polishing stations to perform each polish step to improve throughput. In some embodiments, when the fine polish takes a longer than the rough polish, more polishing stations would be configured to perform the fine polish than the rough polish to increase efficiency. For example, two polishing stations are configured to perform the fine polish while one polishing station is configured to perform the rough polish.

The polishing module 106 includes four polishing stations 116A, 116B, 116C, 116D. Depending on the thickness and type of material to be removed from a substrate, the polishing stations 116A, 116B, 116C, 116D differ by type and chemistry of a polishing slurry used, roughness of the respective polishing pads, and process recipe such as spin rate, force applied to the workpiece, and duration of the polish. In some embodiments, the polishing stations 116A, 116C are configured to perform a first chemical mechanical polish while the polishing stations 116B, 116D are configured to perform a second chemical mechanical polish. In some embodiments, the first chemical-mechanical polish may be a rough polish and the second chemical-mechanical polish may be a fine polish. In some embodiments, the first chemical-mechanical polish may be configured to remove dielectric material from the substrate and the second chemical-mechanical polish may be configured to remove metal from the substrate. During operation, a substrate 102 may be processed first in the polishing station 116A or 116C for the first polish, and then in the polishing station 116B or 116D for the second polish.

After processing in each of the polishing stations 116, contaminants are left on the surface of the substrates. For example, the contaminants include residues of the abrasive particles and chemical additives from the polishing slurry, and residues from the polished surfaces. The cleaning module 108 is configured to remove contaminants from the polished substrate.

In some embodiments, the cleaning module 108 includes two or more cleaning stations 126 configured to perform a multi-stage cleaning process. The cleaning stations 126 may be configured differently to clean the substrate using different cleaning techniques. In the embodiments of FIG. 1A, the cleaning module 108 includes three cleaning stations 126A, 126B, 126C. The cleaning station 126A may be a pre-cleaning station. The cleaning station 126B may be a brush cleaner. The cleaning station 126C may be a megasonic cleaner. Although three cleaning stations 126A, 126B, 126C are illustrated and described, it should be understood that the cleaning module 108 may comprise any number of cleaning stations. In some embodiments, the cleaning module 108 further includes a drying station 128. For example, after polishing, substrates 102 are sequentially transported through the different cleaning stations 126 to remove contaminants from surfaces of the substrates and the drying station 128 before exit the cleaning module 108. In some embodiments, the drying station 128 is a spin-rinse-dry module within which the substrate 102 is rinsed with deionized substrate and then dried before exiting the cleaning module 108. In other embodiments, the drying station 128 may be a Marangoni dryer (using IPA vapor).

The transfer module 110 operable to load and unload substrates from various polishing stations 116 and cleaning stations 126. The transfer module 110 is configured to transfer substrates 102 among various polishing and cleaning stations when the substrate is being processed in the CMP tool 100. For example, the transfer module 110 is configured to transfer substrates 102 between the polishing module 106 and the cleaning module 108. In some embodiments, the transfer module 110 is also configured to transfer substrates 102 among polishing stations 116 in the polishing module 106. In some embodiments, the transfer module 110 is configured to transfer substrates among cleaning stations 126 and the drying station 128 within the cleaning module 108.

According to embodiments of the present disclosure, the transfer module 110 also provides queueing locations while the substrates 102 are waiting for a subsequent process step, for example, waiting to enter the polishing station for a second polish after the first polish, waiting to enter a cleaning station after the polishing processes are complete, or waiting to enter to enter the drying station after the cleaning.

In some embodiments, a wetting solution is provided to the substrates 102 in the transfer module 110, for example, at the one or more queueing locations, so that the substrates 102 do not dry out between processing steps, thus, preventing particles or contaminations from settling on or otherwise sticking to the surfaces of the substrates 102. The wetting solution, such as deionized water, deionized water with additives, may be provided onto the substrates 102 by spraying the substrates 102, immersing the substrates 102 in a wetting bath, or a combination thereof.

FIG. 1B is a schematic partial perspective view of the CMP tool 100 with the factory interface 104 removed. As shown in FIG. 1B, the transfer module 110 is disposed between the polishing module 106 and the cleaning module 108. Alternatively, the transfer module 110 may be positioned in other suitable locations depending on the lay out of the CMP tool 100.

In some embodiments, as shown in FIGS. 1A-1C, the transfer module 110 includes a plurality of wet substrate carriers 136 configured retain one or more substrates in a wetting bath. In some embodiments, the transfer module 110 further includes a transporter 134 configured to move the wet substrate carriers 136 in the CMP tool 100. In some embodiments, the transfer module 110 includes a robot 130 operable to transfer substrates 102 between the wet substrate carriers 136 and the polishing stations 116. The transfer module 110 may include a robot 132 configured to transfer substrates 102 between the wet substrate carriers 136 and the cleaning stations 126/drying station 128. In some embodiments, a single robot may be used in place of the robots 130 and 132.

FIG. 1C is a schematic view of side view of the transfer module 110 according to one embodiment of the present disclosure. In some embodiments, the transfer module 110 is configured to continuously move a series of wet substrate carriers 136 in the CMP tool 100. In FIG. 1C, the transporter 134 is a conveyor system configured to circulate the plurality wet substrate carriers 136 in the transfer module 110 to facilitate substrate transfer at different stage of operations. In some embodiments, the transporter 134 may be vertically arranged to reduce footprint of the CMP tool 100, or to retrofit within an existing CMP tool 100. The transporter 134 includes an upper conveyor portion 134*u*, a lower conveyor portion 134*l*, and two end conveyor portions 134*e*. The upper conveyor portion 134*u* and lower conveyor portion 134*l* may be substantially linear and configured to move the wet substrate carriers 136 along linear paths. In some embodiments, the upper conveyor portion 134*u* and lower conveyor portion 134*l* may move along opposite directions, and the end conveyor portions 134*e* are configured to move the wet substrate carriers 136 between the upper conveyor portion 134*u* and lower conveyor portion 134*l*. In some embodiments, the upper conveyor portion 134*u* may be configured to move the wet substrate carriers 136 along a first direction, for example from away from the factory interface 104. The lower conveyor portion 134*l* may be configured to move the wet substrate carriers 136 along a second direction, for example towards the factory interface 104. The end conveyor portions 134*e* may include a vertical actuator move vertically between the upper conveyor portion 134*u* and lower conveyor portion 134*l*. In some embodiments, the transporter 134 may include additional conveyor portions to provide a desired path for the wet substrate carriers 136.

The conveyors portions 134*u*, 134*l*, 134*e* may be include any suitable conveyor designs, such as roller conveyors, belt conveyors, bucket conveyors, or any suitable conveying mechanisms known to persons skilled in the art. The transporter 134 may include a conveyor system of different arrangements, for example, in a planar arrangement with linear conveyor portions and rotatable corner conveyor portions. In some embodiments, instead of using a conveyor system, the transporter 134 may include other mechanisms for transporting the wet substrate carriers, for example, automated guided carts, collaborative robots, and the like.

As discussed above, the wet substrate carrier 136 is configured to retain a wetting bath in which the substrate 102 is immersed during transfer. In some embodiments, the transfer module 110 includes or is in connection with a wetting solution source 138 configured to fill the wet substrate carriers 136 with the wetting solution. In some embodiments, the wetting solution source 138 may be a deionized water source. In some embodiments, the wetting solution source 138 may include one or more additive sources to mix with the deionized water. In some embodiments, the wetting solution source 138 may be an existing solution source used by one of the cleaning stations 126. In some embodiments, the transfer module 110 includes or is in connection with a draining tank 140 configured to receive spent wetting solution from the wet substrate carriers 136. The draining tank 140 may include a filtration system configured to filter and reclaim the spent wetting solution. The filtration system may reclaim a portion of the spent wetting solution, circulate the reclaimed portion back to the wetting solution source 138, and deliver the remainder to a drain 142.

Figure 2B:
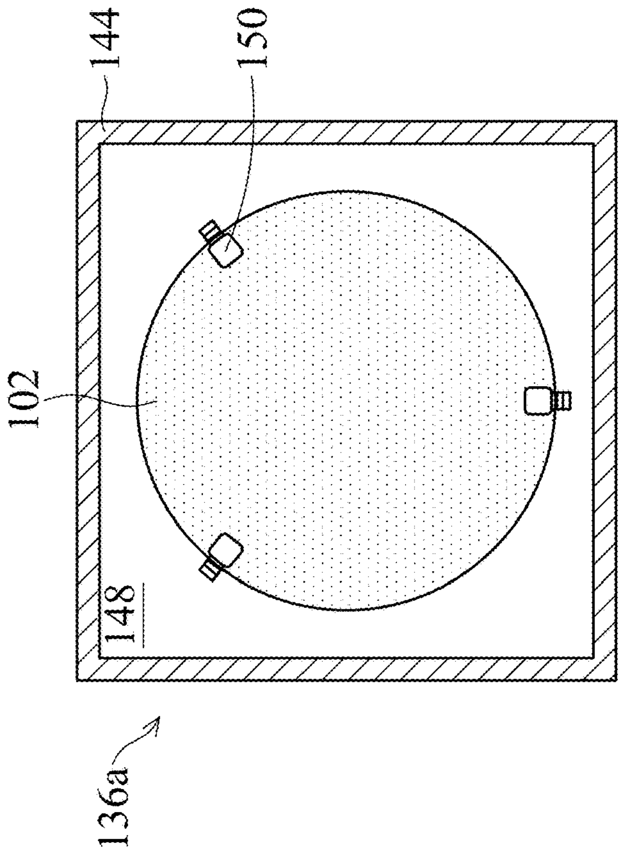
FIGS. 2A-2B are schematical views of a wet substrate carrier according to embodiments of the present disclosure.
Figure 2A:
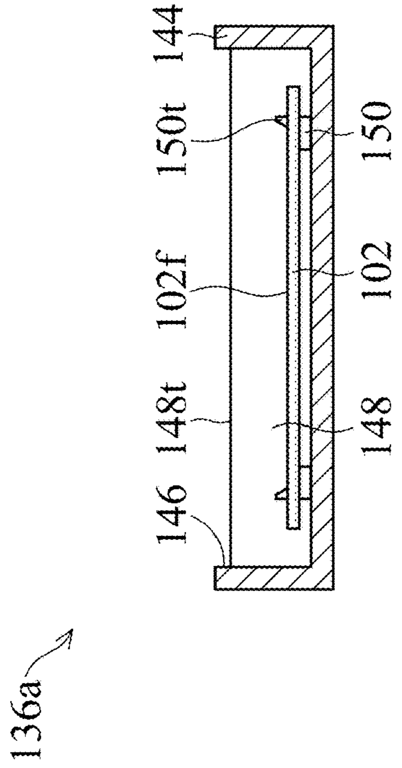

FIGS. 2A-2B are schematical views of a wet substrate carrier 136*a* according to embodiments of the present disclosure. The wet substrate carriers 136*a* may be used as the wet substrate carriers 136 in FIGS. 1A-1C. FIG. 2A is a schematic sectional view of the wet substrate carrier 136*a*. FIG. 2B is a schematic top view of the wet substrate carrier 136*a*.

The wet substrate carrier 136*a* may include a housing 144 defining an inner volume 146 to retain a wetting solution 148 therein. The inner volume 146 has an upper opening to allow immersion of a substrate 102. In some embodiments, the housing 144 may be a squared box for holding one substrate therein. In some embodiments, the inner volume 146 has a rectangular shape. In other embodiments, the inner volume 146 may have other shapes, such as a circular shape. In some embodiments, the housing 144 may be circular, such as circular basin with a circular inner volume 146. In some embodiments, the wet substrate carrier 136*a* may include two or more pins 150 for supporting the substrate 102 therein. The two or more support pins 150 may be arranged to be in contact with the substrate 102 near an edge region when the substrate 102 is disposed in the wet substrate carrier 136*a*. In some embodiments, each support pin 150 may include a tapered tip 150*t* to guide and center the substrate 102 when receiving the substrate. During operation, the wetting solution 148 is retained in the inner volume 146. The substrate 102 may be positioned with a device surface 102*f* facing up. The device surface 102*f* is positioned below a top surface 148*t* of the wetting solution 148 so that the substrate 102 is effectively immersed in the wetting solution 148.

Figure 3B:
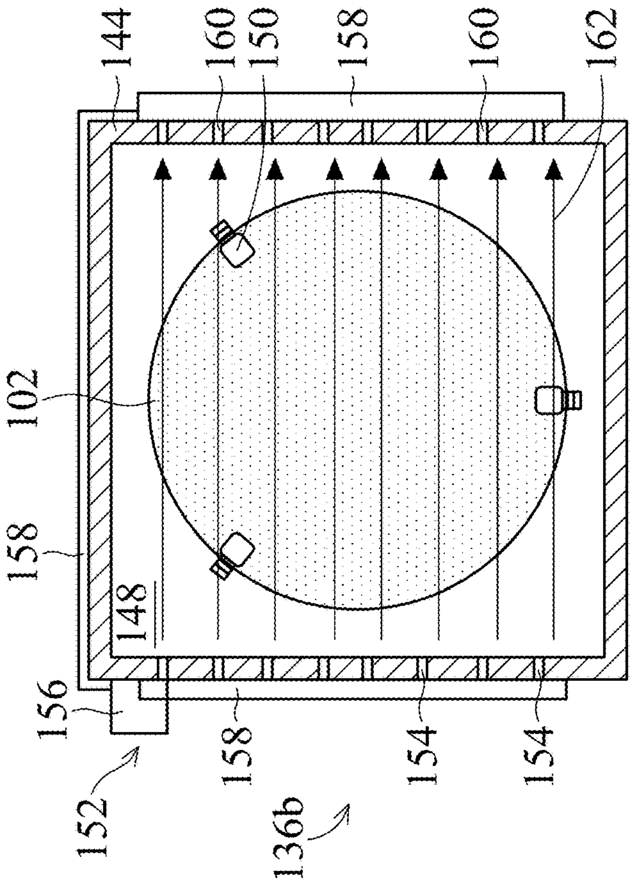
FIGS. 3A-3H are schematical views of a wet substrate carrier according to embodiments of the present disclosure.
Figure 3A:
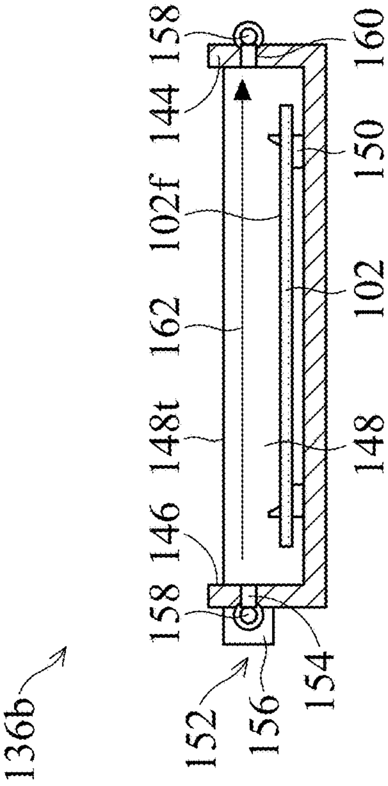

FIGS. 3A-3G are schematical views of a wet substrate carrier 136*b* according to embodiments of the present disclosure. The wet substrate carriers 136*b* may be used as the wet substrate carriers 136 in FIGS. 1A-1C. FIG. 3A is a schematic sectional view of the wet substrate carrier 136*b*. FIG. 3B is a schematic top view of the wet substrate carrier 136*b*.

Similar to the wet substrate carrier 136*a*, the wet substrate carrier 136*b* may include the housing 144 defining an inner volume 146 to retain a wetting solution 148 therein. The inner volume 146 has an upper opening to allow immersion of a substrate 102. Two or more pins 150 are disposed in the inner volume 146 for supporting the substrate 102 therein.

The wet substrate carrier 136*b* includes a stream generating assembly 152 configured to generate flow streams 162 in the wetting solution 148. In some embodiments, the stream generating assembly 152 includes one or more injects 154, one or more outlets 160, a conduit 158 connecting the one or more injects 154 to the one or more outlets 160, and a pump 156 connected to the conduit 158 to propel a flow therethrough. The one or more injects 154 and the one or more outlets 160 are open to the inner volume 146. In some embodiments, the one or more injects 154 and the one or more outlets 160 are disposed on opposite sides of the inner volume 146. For example, the one or more injects 154 may be disposed along one side of a rectangular shaped housing 144, and the one or more outlets 160 are disposed on an opposing side of the rectangular shaped housing 144. In some embodiments, the one or more injects 154 and the one or more outlets 160 may be used interchangeably, by switching direction of the flow in the conduit 158.

In some embodiments, the one or more injects 154 may be identical and evenly distributed along one side of the housing 144. In other embodiments, the one or more injects 154 may be off different dimensions to achieve desired stream pattern in the wetting solution 148. In some embodiments, the one or more injects 154 includes a plurality of injects evenly distributed in the housing 144. In some embodiments, each on the one or more injects 154 may be a flow channel formed in the housing 144. For example, each inject 154 may be a through hole formed through the housing 144. In other embodiments, the one or more injects 154 may be a manifold disposed in the inner volume 146 of the housing 144. In some embodiments, a nozzle may be disposed in each inject 154 to control flow rate and/or direction.

During operation, the one or more injects 154, the conduit 158, the one or more outlets 160, and the inner volume 146 form a closed loop for fluid circulation. The pump 156 propels the fluid flow and generates flow streams 162 in the inner volume 146. In some embodiments, the flow streams 162 may be directed above the device surface 102*f* of the substrate 102 disposed in the wet substrate carrier 136*b*. The flow streams 162 agitate the wetting solution 148 preventing contaminations from settling down and stuck to the device surface 102*f*. In some embodiments, the flow streams 162 may be continuously generated in the wetting solution 148. In other embodiments, the flow streams 162 may be generated periodically, or in pulses.

As discussed in FIGS. 1A-1C, the plurality of wet substrate carriers 136 move continuously in the CMP tool 100. In some embodiments, a plurality of wet substrate carriers 136*b* are included in the transfer module 110. The wet substrate carriers 136*b* may be disposed on the transporter 134 so the flow streams 162 in the wet substrate carriers 136*b* are at certain angle relative to the moving direction of the wet substrate carriers 136, i.e. the substrate transfer direction.

Figure 3C:
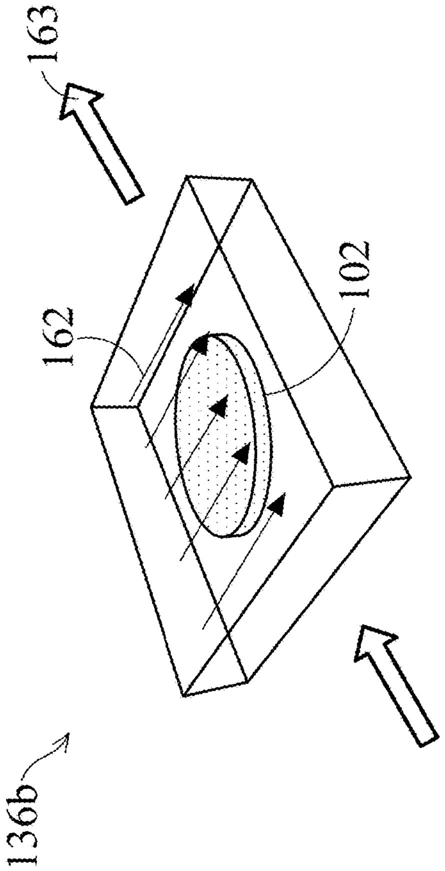
Figure 3D:
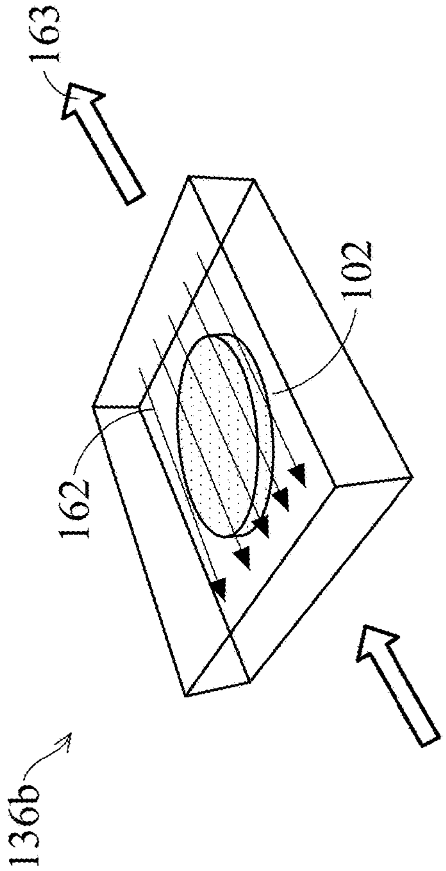
Figure 3E:
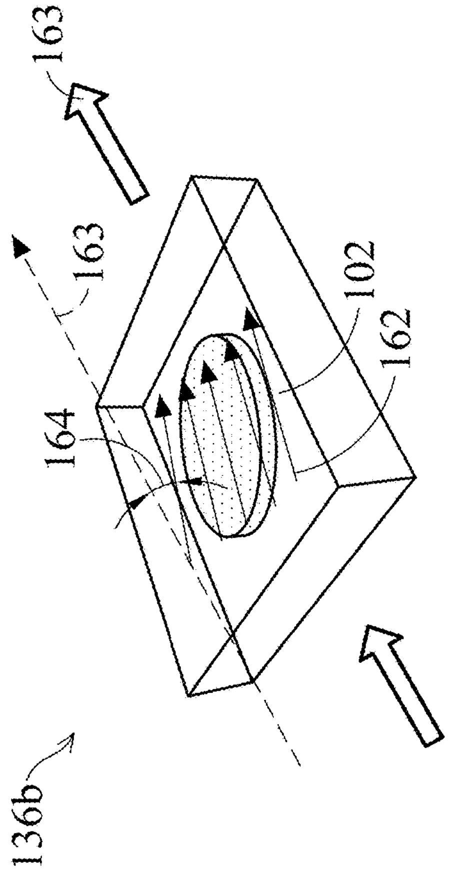

FIGS. 3C-3F schematically demonstrate various configuration of the flow streams 162 and substrate transfer direction. In FIGS. 3C-3F, the substrate transfer direction is marked by arrows 163. The relative direction of between the flow streams 162 and the substrate transfer direction may affect the various processing effects, such as the homogeneity of the wetting bath 146, the flow distribution across the substrate 102 being transferred. In FIG. 3C, directions of the flow streams 162 in the wet substrate carriers 136 are substantially perpendicular to the substrate transfer direction. In FIG. 3D, directions of the flow streams 162 in the wet substrate carriers 136 are substantially parallel to the substrate transfer direction. In FIG. 3E, directions of the flow streams 162 in the wet substrate carriers 136 are at an angle 164 from the substrate transfer direction. The angle 164 may be in a range from 0 to 180 degrees.

Figure 3F:
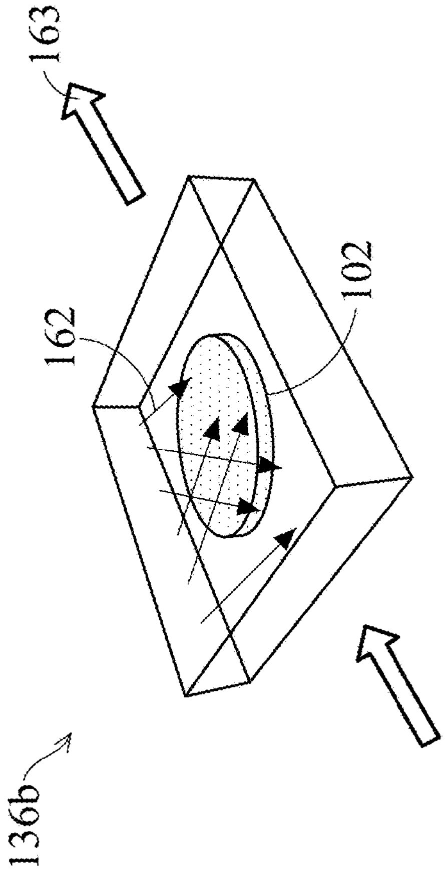

In the embodiments in FIGS. 3C-3E, the flow streams 162 are substantially parallel to each other. In other embodiments the flow streams 162 are not parallel to each other. In some embodiments, the flow streams 162 may be arranged in a pattern. In other embodiments, the flow streams 162 may be randomly arranged, as shown in FIG. 3F.

Figure 3G:
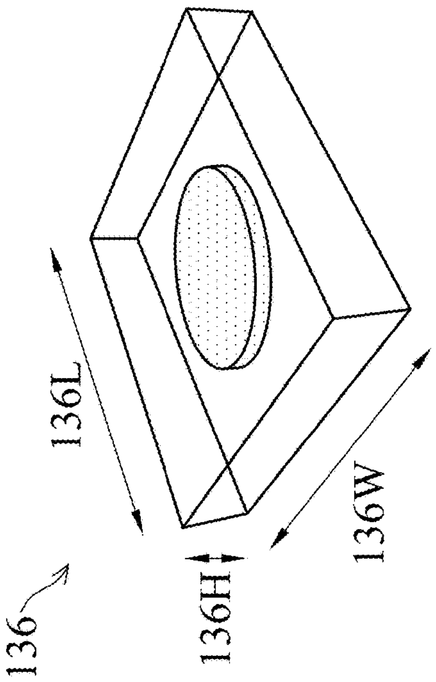

FIG. 3G is a schematic perspective view of the substrate wet carrier 136 according to the present disclosure. Dimensions of the inner volume 146 in the substrate wet carrier 136 are selected to retain enough wetting solution to immerse one or more substrates 102 therein. As shown in FIG. 3G, the substrate wet carrier 136 may have a height 136H, a width 136W, and a length 136L. The width 136W refers to the dimension of the wet substrate carrier 136 along the direction perpendicular to the substrate transfer direction. The length 136L refers to the dimension of the wet substrate carrier 136 along the direction parallel to the substrate transfer direction. In some embodiments, the height 136H may be in a range between 0.3 cm and 100 cm. A height less than 0.3 cm may not retain enough wetting solution to immerse the substrate 102. A height greater than 100 cm may take up extra space and wetting solution without additional benefit. In some embodiments, the length 136L may be in a range between 30 cm and 500 cm. A length shorter than 30 cm may not be long enough to retain a substrate 102 therein. A length longer than 500 cm may take up extra space and wetting solution without additional benefit. In some embodiments, the width 136W may be in a range between 30 cm and 500 cm. A width narrower than 30 cm may not be long enough to retain a substrate 102 therein. A width wider than 500 cm may take up extra space and wetting solution without additional benefit.

Figure 3H:
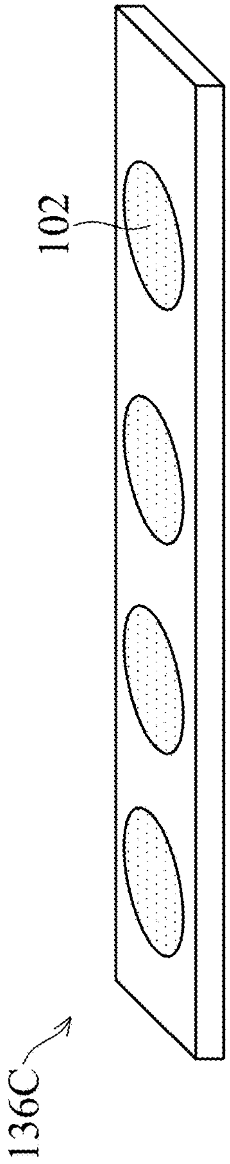

Even though the wet substrate carriers 136 described above are shown to retain one substrate 102 therein, wet substrate carriers according to the present disclosure may be designed to retain two or more substrates therein. FIG. 3H schematically illustrates a wet substrate carrier 136*c* designed to retain four substrates 102 in a row. Other arrangements may be used according to various tool configurations.

Even though the wet substrate carriers 136 are movable within the CMP tool 100 shown in FIGS. 1A-1C, the wet substrate carrier 136 according to the present disclosure may be stationary in a CMP tool 100 to receive and retain one or more substrates 102 in between processes to keep the substrates from drying out.

As discussed above, the CMP tool 100 includes the transfer module 110 to provide a wetting solution to the substrate being transferred. The wetting bath in the wet substrate carrier 136 keeps the substrates 102 from drying while the substrates 102 are in the wet substrate carrier 136. However, the substrates 102 are still exposed to the air while transferring to and from the wet substrate carrier 136. To prevent the substrates 102 from drying out while not in the wet substrate carrier 136, one or more additives may be sprayed or otherwise provided onto the substrate surface to make the device surface 102*f* a hydrophilic surface.

It has been observed that a hydrophobic surface has a larger contact angle with a water drop, therefore, is easier to dry out while a hydrophilic surface has a smaller contact angle with a water drop, therefore, is harder to dry out. Because the polished substrate surface may include areas formed from materials of hydrophobic characteristics, such as silicon, polycrystalline silicon, Hafnium oxides, and other high-k materials, areas on the polished substrate surface are easily dried out.

It also has been observed that there is an attractive force in hydrophobic interactions. Particularly, particles with hydrophobic surfaces exhibit an attractive force between them, and the attractive force increases as the distance between the two particles reduces; a particle with hydrophobic surfaces and a particle with hydrophilic surfaces exhibit a slight attractive force between them, and the force changes from slightly attractive to slightly repulsive as the distance between the two particles reduces; and particles with hydrophilic surfaces exhibit a repulsive force between them, and the repulsive force increases as the distance between the two particles reduces when the distance is greater than about 20 nm.

Figure 4B:
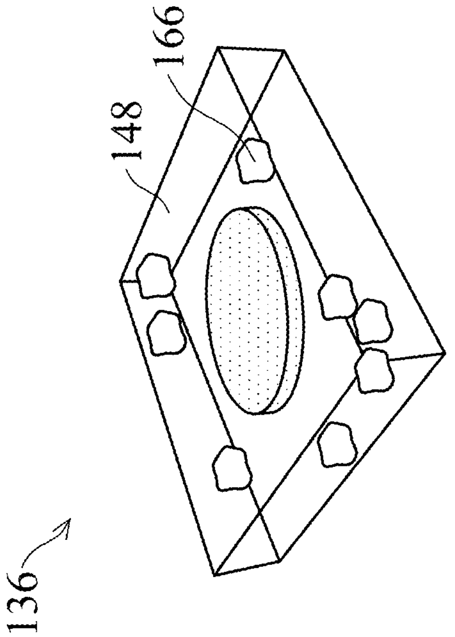
FIGS. 4A and 4B are schematic views of a wet substrate carrier in connection to a source of additive according to embodiments of the present disclosure.
Figure 4A:
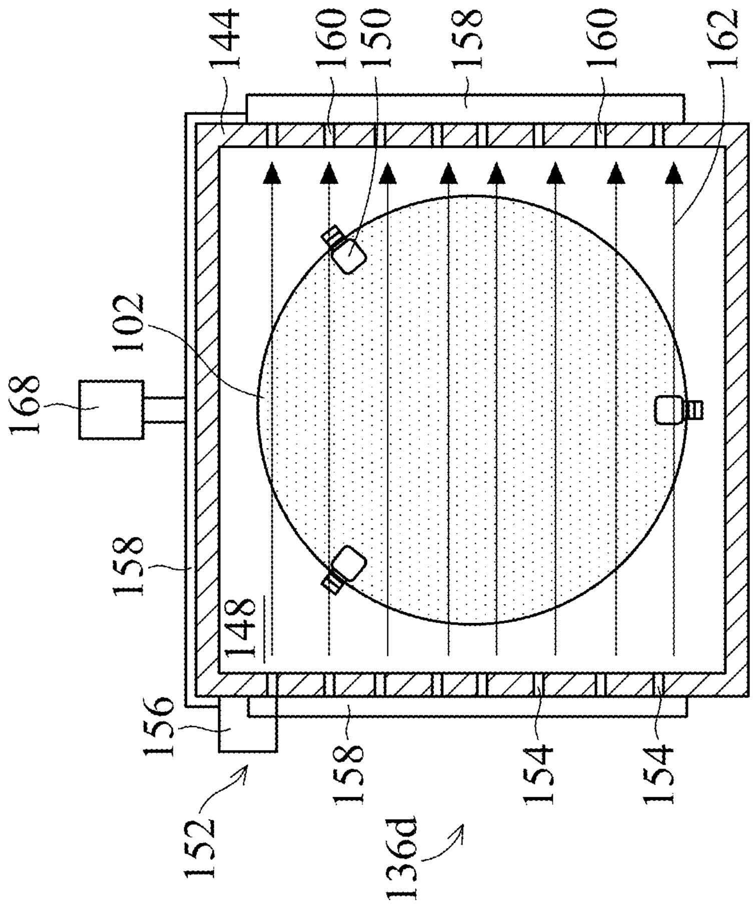

Based on the observations from FIG. 4A, if a substrate surface is hydrophobic, it is likely to attract hydrophobic particles causing defects in subsequent process. Embodiments of the present disclosure include a hydrophilic treatment to change surfaces of the substrate and/or particles on the substrates to hydrophilic when a substrate surface is hydrophilic to reduce the hydrophobic attraction and reduce defects. In some embodiments, the hydrophilic treatment may be performed by providing one or more treatment chemicals to the substrate surface. In some embodiments, the treatment chemicals may include a surfactant, a photocatalyst, carbon dioxide, ozone, or a combination thereof. Suitable surfactant may include an alkyl cationic surfactant, an amide-type quaternary cationic surfactant, an ester-type quaternary cationic surfactant, an amine oxide surfactant, a betaine surfactant, an alkoxylate surfactant, a fatty acid ester surfactant, an amide surfactant, an alcohol surfactant, an ethylenediamine surfactant, or a fluorine- and/or silicon-containing surfactant, or a combination thereof. Suitable photocatalyst may include iron, titanium, zinc, manganese, silver, platinum, and corresponding oxide. For example, the photocatalyst may be a metal oxide such as titanium oxide ($TiO_2$), iron oxide ($Fe_2O_3$), manganese dioxide, and zinc oxide (ZnO), or a combination thereof.

In some embodiments, pH value of the wetting solution may be adjusted so the pH value is corresponding to or close to zero isoelectric point pH value for the materials being polished. When particles with zero isoelectric point or close to zero isoelectric point are less likely to attract and attach to the substrate, thus, reducing defects. In some embodiments, pH value of the wetting solution may be adjusted by dissolving carbon dioxide or ozone in the wetting solution.

In some embodiments, the hydrophilic treatment may be performed injecting one or more additives with the wetting solution. For example, the one or more additives may be provided in the wetting solution in the wet substrate carrier 136. FIGS. 4A-4B are schematic views of a wet substrate carrier 136*d* in connection to a source of additive according to embodiments of the present disclosure.

Similar to the wet substrate carriers 136*a* and 136*b*, the wet substrate carrier 136*d* may include the housing 144 defining an inner volume 146 to retain a wetting solution 148 therein. The inner volume 146 has an upper opening to allow immersion of a substrate 102. Two or more pins 150 are disposed in the inner volume 146 for supporting the substrate 102 therein. Similar to the wet substrate carrier 136*b*, the wet substrate carrier 136*d* includes the stream generating assembly 152 configured to generate the flow streams 162 in the wetting solution 148. In some embodiments, a chemical source 168 is connected to the conduit 158 to provide one or more additives 166 to the wetting solution 148. The chemical source 168 may be selectively injects the one or more additives to the wetting solution 148 during circulation of the wetting solution 148.

Alternatively, one or more additives 166 may be premixed to the wetting solution 148. For example, when the wetting solution 148 is not circulated as in the wet substrate carrier 136*a*. In some embodiments, the chemical source 168 may be connected to the wetting solution source 138, shown in FIG. 1C, of the CMP tool 100.

In some embodiments, the wetting solution 148 may be a surfactant dissolved in deionized water at a concentration range between 0.1% to 8% by weight. A concentration lower than 0.1% by weight may not be enough to change a surface area from hydrophobic to hydrophilic. A concentration higher than 8% may increase cost without providing additional benefit.

In some embodiments, the wetting solution 148 may be a photocatalyst dissolved in deionized water at a concentration range between 0.1% to 8% by weight. A concentration lower than 0.1% by weight may not be enough to change a surface area from hydrophobic to hydrophilic. A concentration higher than 8% may increase cost without providing additional benefit.

In some embodiments, the wetting solution 148 may be carbon dioxide dissolved in deionized water at a concentration range between 0.1% to 8% by weight. A concentration lower than 0.1% by weight may not be enough to change a surface area from hydrophobic to hydrophilic. A concentration higher than 8% may increase cost without providing additional benefit.

In some embodiments, the wetting solution 148 may be ozone dissolved in deionized water at a concentration range between 0.1% to 8% by weight. A concentration lower than 0.1% by weight may not be enough to change a surface area from hydrophobic to hydrophilic. A concentration higher than 8% may increase cost without providing additional benefit.

With the transfer module 110 to keep the substrates 102 from drying out with the wet substrate carriers 136, the CMP tool 100 can reduce defects and improve throughput. The transfer module 110 in the CMP tool 100 includes wet substrate carriers 136 moving continuously during processing. Substrates may be kept moist by other arrangements as discussed below.

Figure 5A:
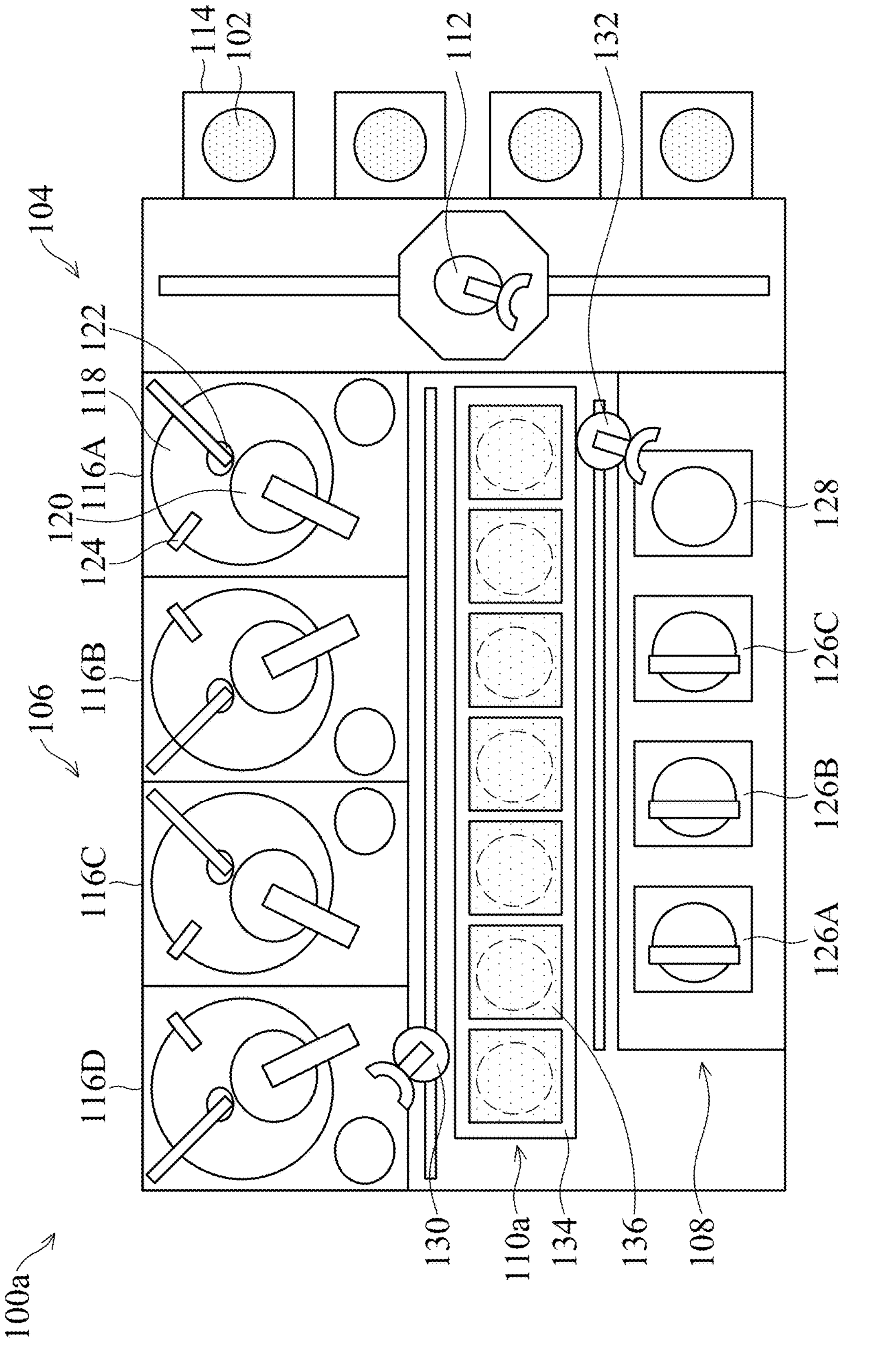
FIG. 5A is a schematic block diagram of a CMP tool in accordance with some embodiments of the present disclosure.
Figure 5B:
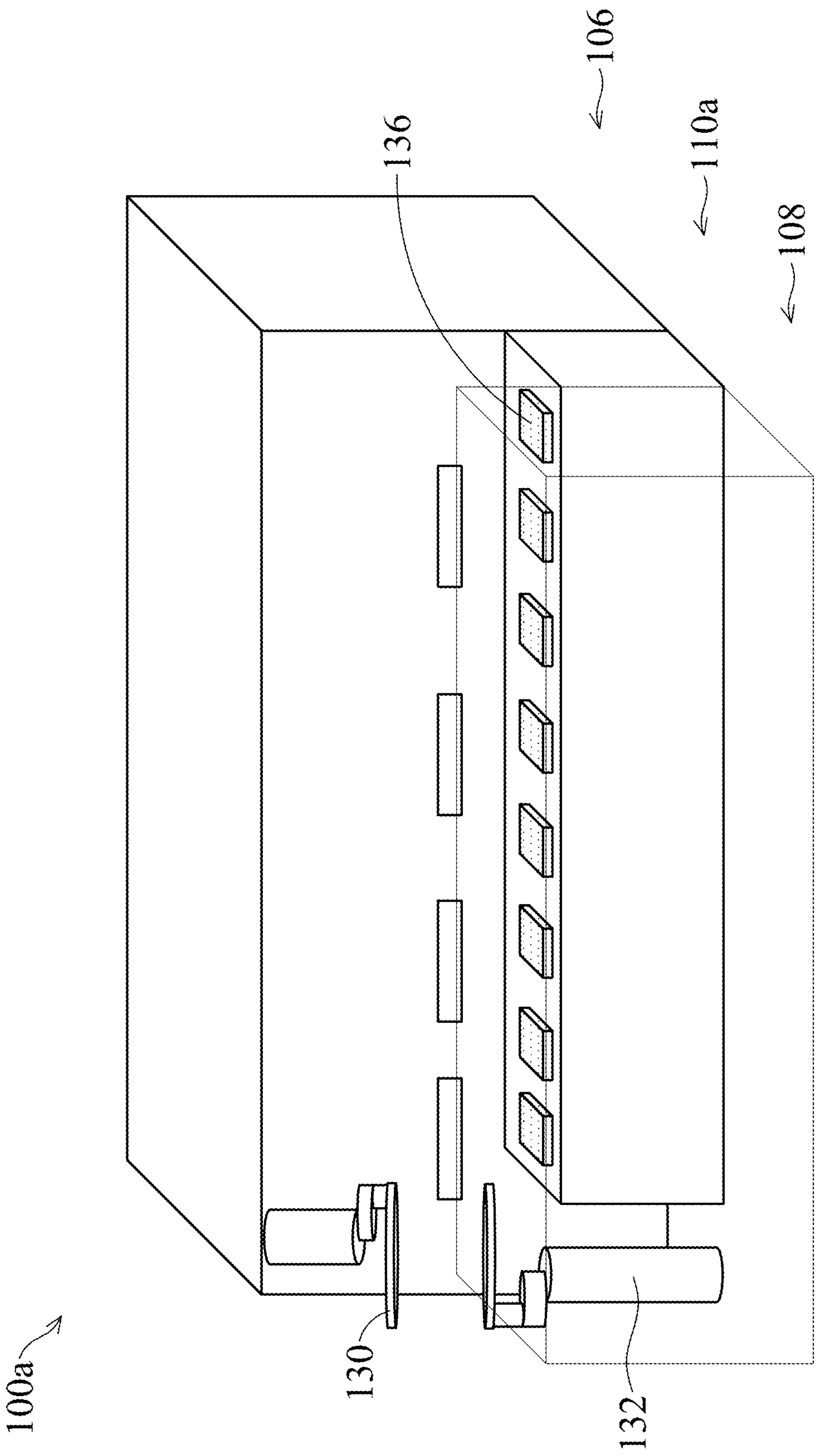
FIG. 5B is a schematic partial perspective view of the CMP tool of FIG. 5A.
Figure 5C:
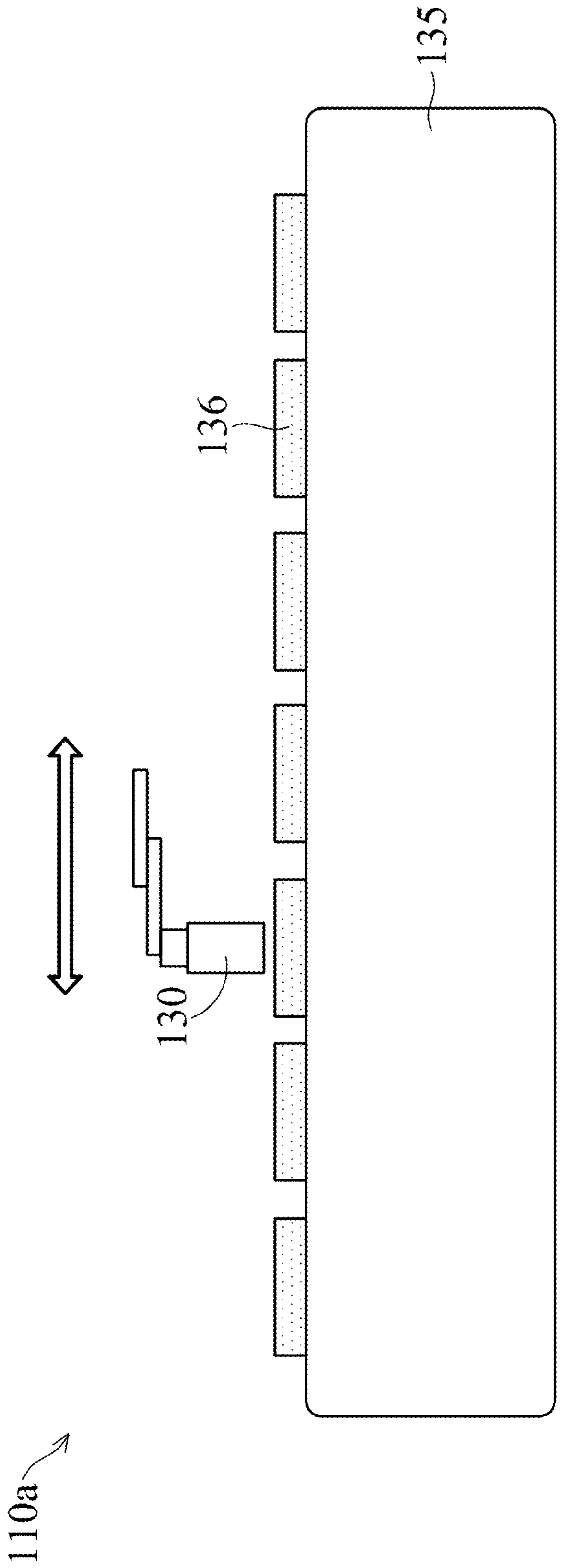
FIG. 5C is a schematic view of side view of a substrate transporter in the CMP tool of FIG. 5A.

FIG. 5A is a schematic block diagram of a CMP tool 100*a* in accordance with some embodiments of the present disclosure. FIG. 5B is a schematic partial perspective view of the CMP tool 100*a*. FIG. 5C is a schematic view of side view of a substrate transporter in the CMP tool 100*a*. The CMP tool 100*a* is similar to the CMP tool 100 except that the CMP tool 100*a* includes a transfer module 110*a* in which the wet substrate carriers 136 remain stationary during operation. As shown in FIG. 5C, the transfer module 110*a* includes a carrier support frame 135 on which the plurality of wet substrate carriers 136 are disposed. The robots 130, 132 may move along the carrier support frame 135 to transfer the substrates 102 to and from the wet substrate carriers 136. The wet substrate carriers 136 may be the wet substrate carriers 136*a*, 136*b*, 136*c*, 136*d* or a combination thereof. In some embodiments, the wet substrate carriers 136 and/or the wetting solution 148 may vary to retain substrates at different stages of operation.

Figure 6A:
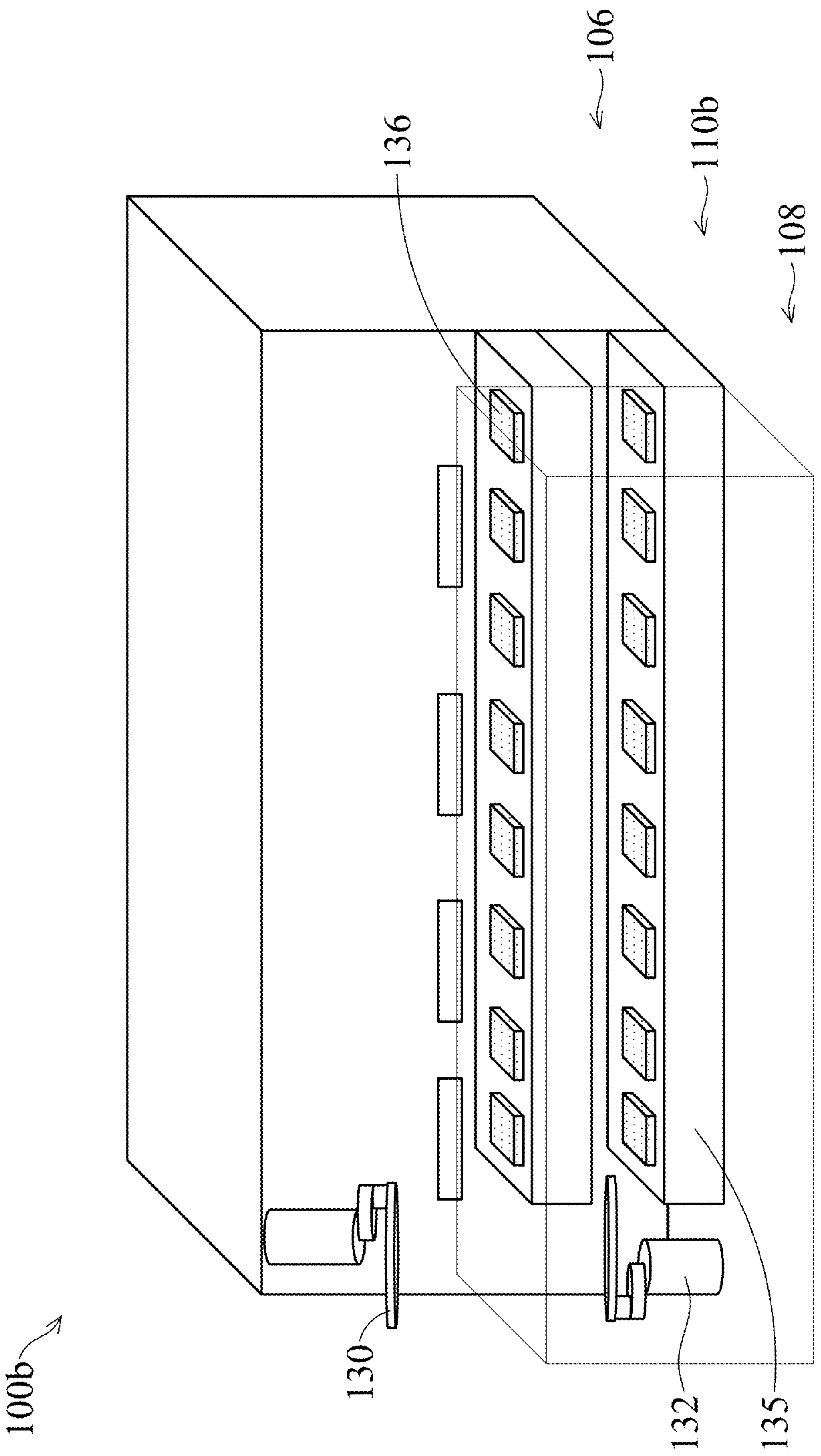
FIG. 6A is a schematic partial perspective view of a substrate transporter for a CMP tool according to embodiments of the present disclosure.
Figure 6B:
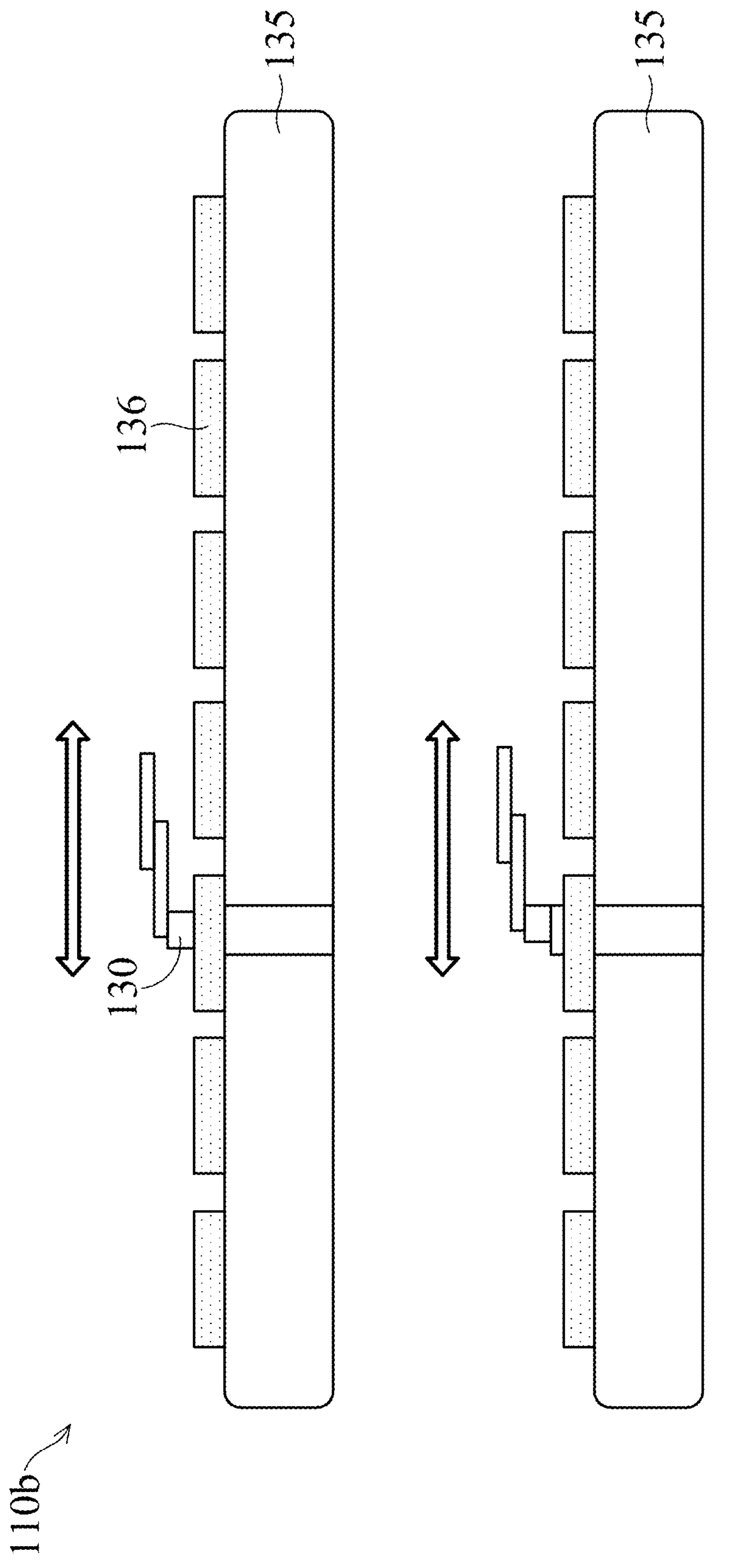
FIG. 6B is a schematic view of side view of a substrate transporter in the CMP tool of FIG. 6A.

FIG. 6A is a schematic partial perspective view of a CMP tool 100*b* according to embodiments of the present disclosure. FIG. 6B is a schematic view of side view of a substrate transporter in the CMP tool 100*b*. The CMP tool 100*b* is similar to the CMP tool 100*a* except that the CMP tool 100*b* includes a transfer module 110*b* having two rows of the wet substrate carriers 136 remain stationary during operation. As shown in FIG. 6B, the carrier support frame 135 supports two vertically rows of the plurality of wet substrate carriers 136 to improve throughput. Even though two vertical rows of the wet substrate carriers 136 are shown in the CMP tool 100*b*, more rows of the wet substrate carriers 136 may be used, and the wet substrate carriers 136 may be arranged horizontally or positioned to fit in space around the polishing module 106 and the cleaning module 108.

Figure 7:
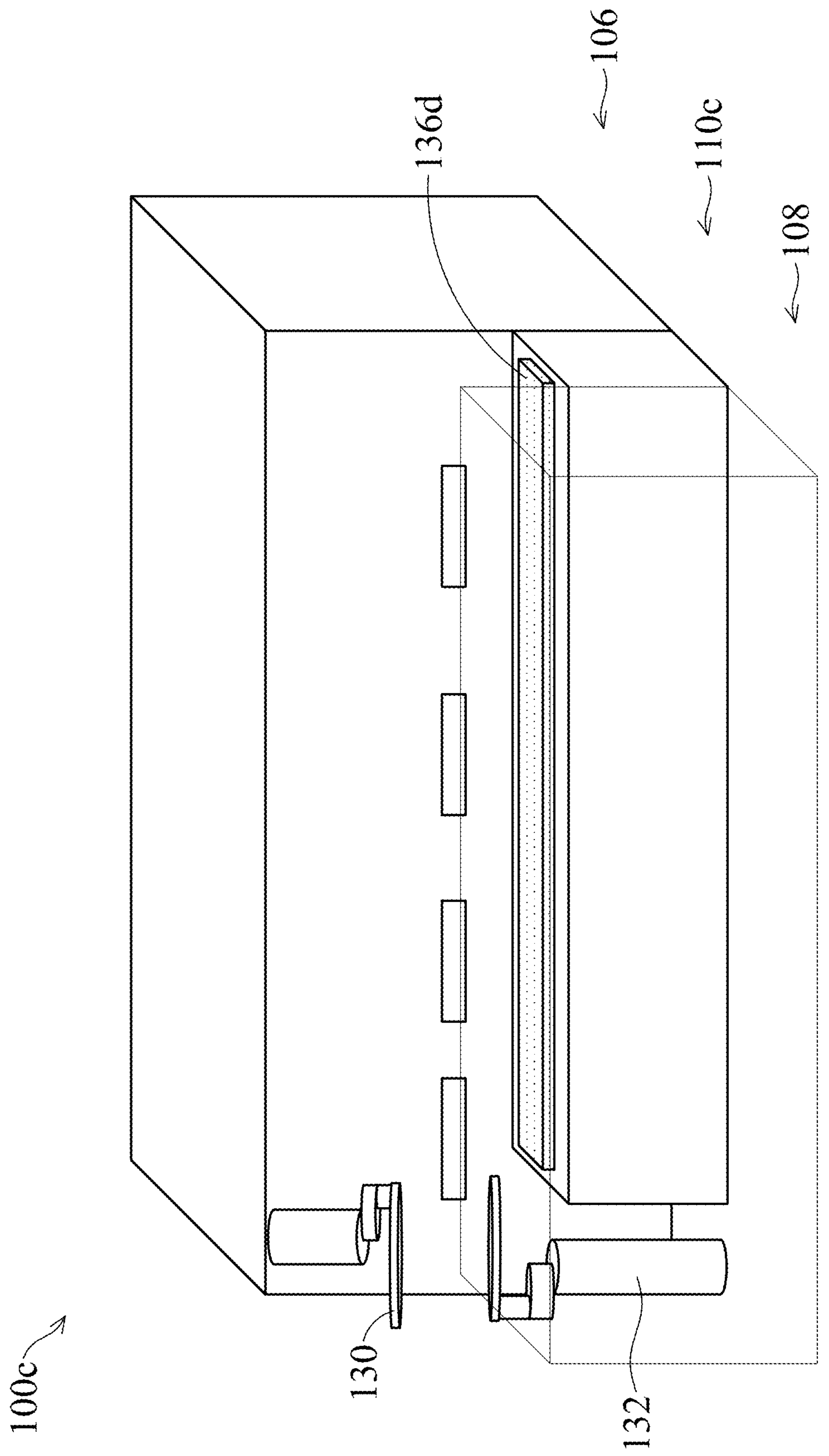
FIG. 7 is a schematic partial perspective view of a substrate transporter for a CMP tool according to embodiments of the present disclosure.

FIG. 7 is a schematic partial perspective view of a CMP tool 100*c* according to embodiments of the present disclosure. The CMP tool 100*c* is similar to the CMP tool 100*a* except that the CMP tool 100*c* includes a transfer module 110*c* having one stationary wet substrate carriers 136*d* to hold multiple substrates 102.

Figure 8A:
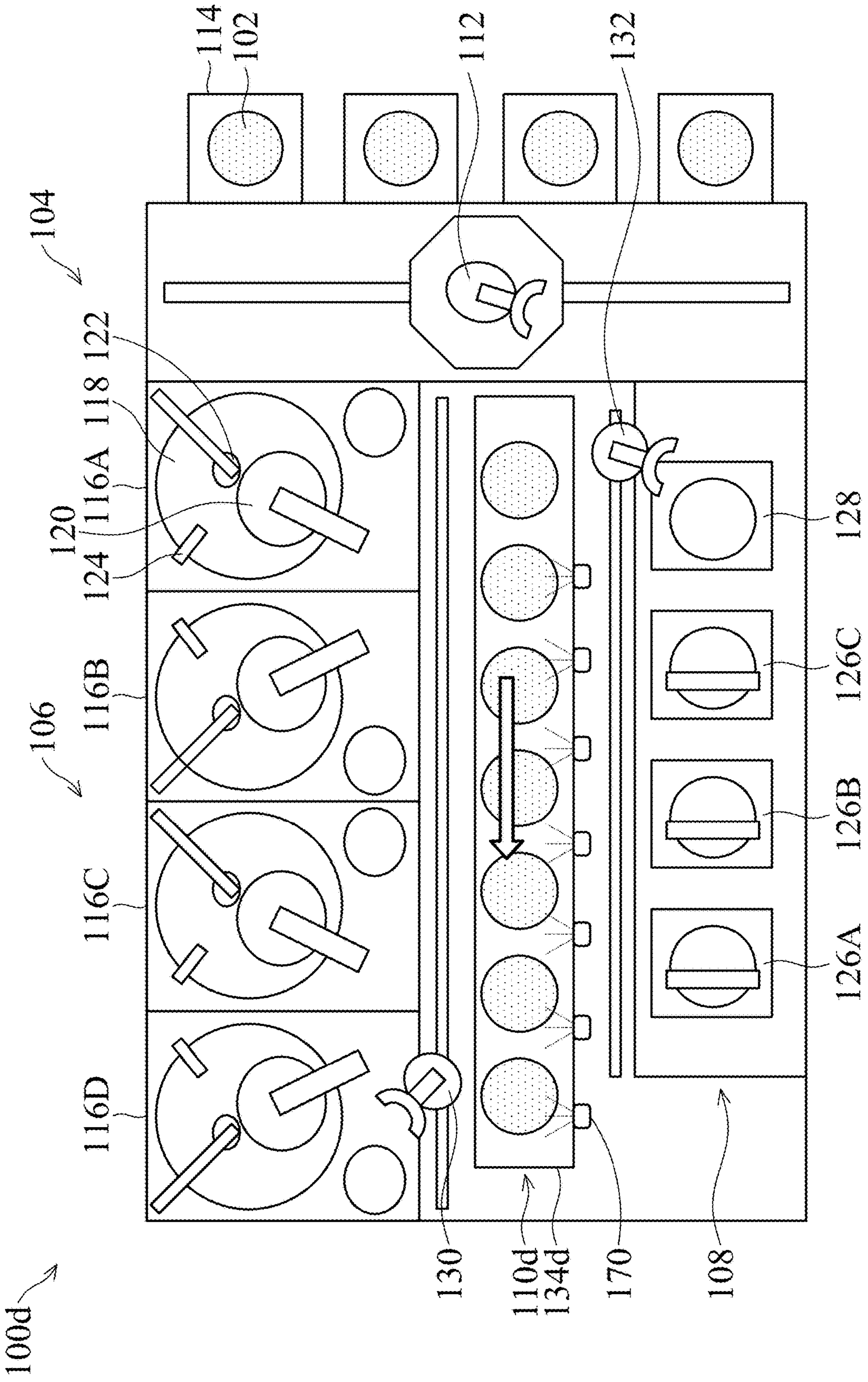
FIG. 8A is a schematic block diagram of a CMP tool in accordance with some embodiments of the present disclosure.
Figure 8B:
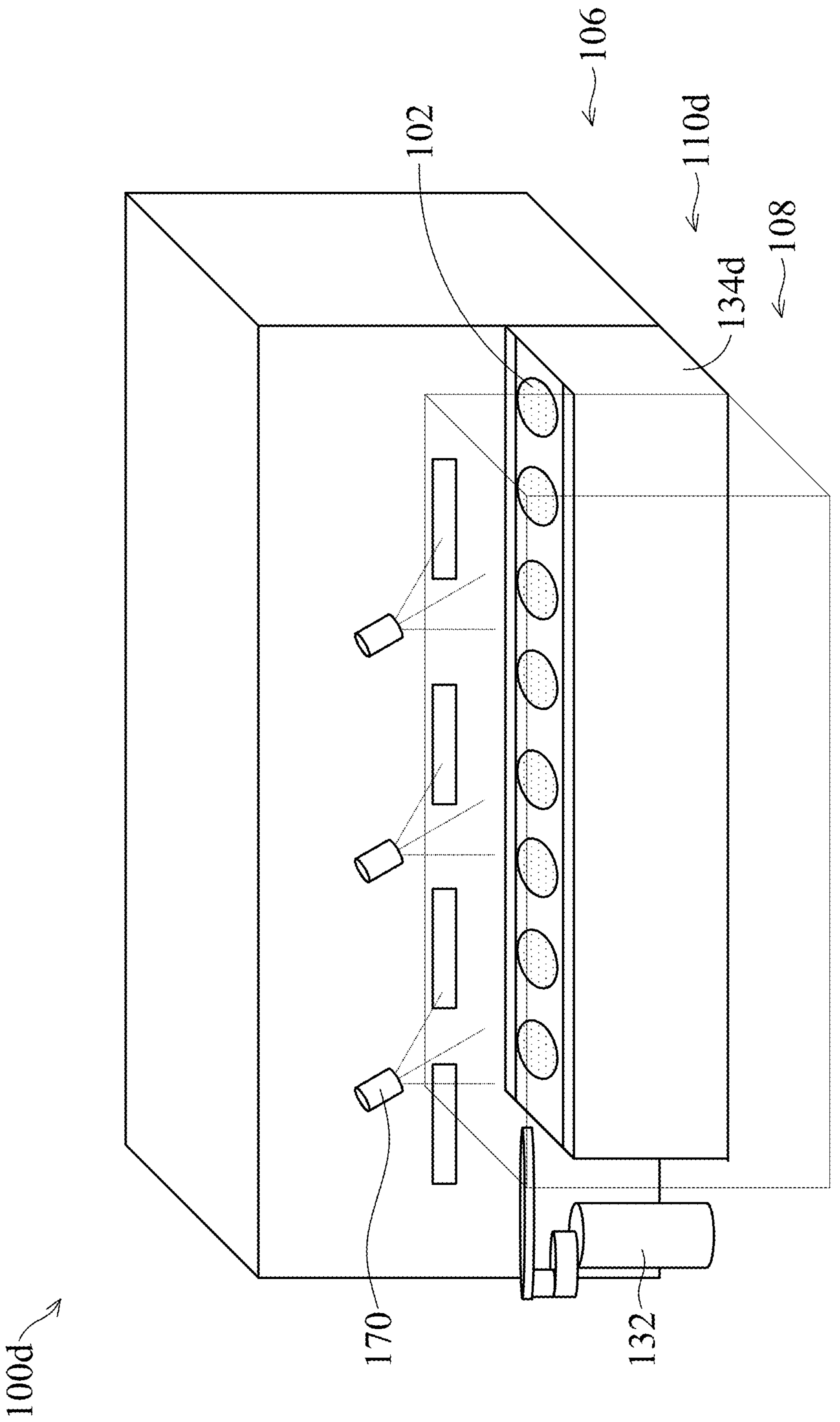
FIG. 8B is a schematic partial perspective view of the CMP tool of FIG. 8A.

FIG. 8A is a schematic block diagram of a CMP tool 100*d* in accordance with some embodiments of the present disclosure. FIG. 8B is a schematic partial perspective view of the CMP tool 100*d*. The CMP tool 100*d* is similar to the CMP tool 100 except that the CMP tool 100*d* does not use the wet substrate carriers 136. The CMP tool 100*d* includes a transfer module 110*d* configured to transfer a plurality of substrates 102 through the CMP tool 100*d*. The transfer module 110*d* may include a transporter 134*d* configured to directly transfer the substrates 102. In some embodiments, the transporter 134*d* may be a conveyor system. The transporter 134*d* may be configured to move the substrates 102 in a continuous manner during operation.

The CMP tool 100*d* includes one or spraying nozzles 170 configured to spray a wetting solution onto the substrates 102 being transferred by the transfer module 110*d*. In some embodiments, the spraying nozzles 170 may be stationary. In other embodiments, the spraying nozzles 170 may move along the transporter 134*d*. The spraying nozzles 170 may be connected to a wetting solution tank. In some embodiments, the wetting solution may be deionized water. In other embodiments, the wetting solution may be deionized water with one or more additives, such as a surfactant, a photocatalyst, CO2, ozone. In some embodiments, the spraying nozzles 170 may be continuously. In other embodiments, the spraying nozzles 170 may spray the wetting solution periodically.

Figure 9:
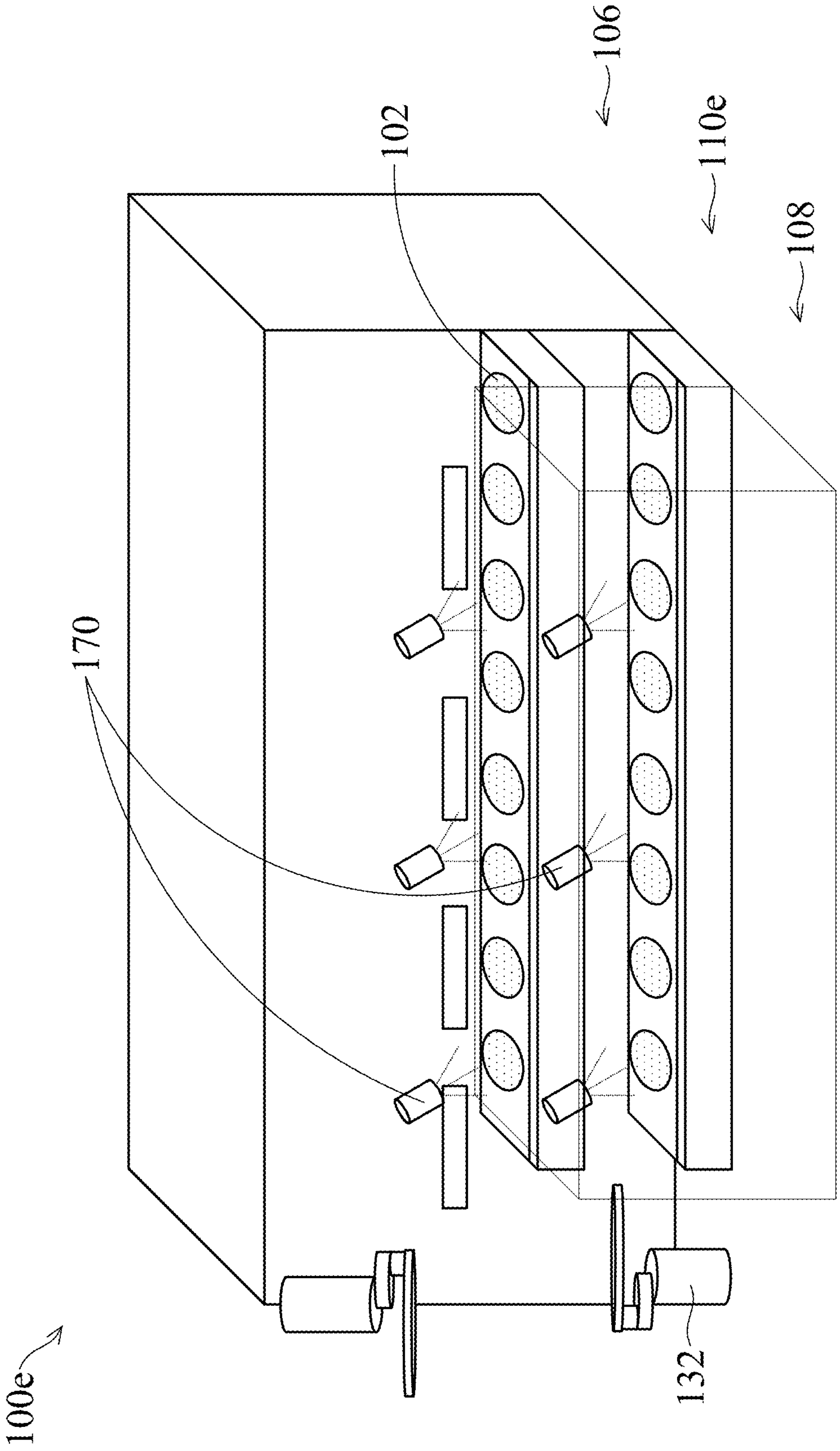
FIG. 9 is a schematic partial perspective view of a CMP tool according to another embodiment of the present disclosure.

FIG. 9 is a schematic partial perspective view of a CMP tool 100*e* according to another embodiment of the present disclosure. The CMP tool 100*e* is similar to the CMP tool 100*d* except that the CMP tool 100*e* includes a transfer module 110*e* configured to transfer two or more streams of substrates 102 in a parallel manner to improve throughput.

Figure 10A:
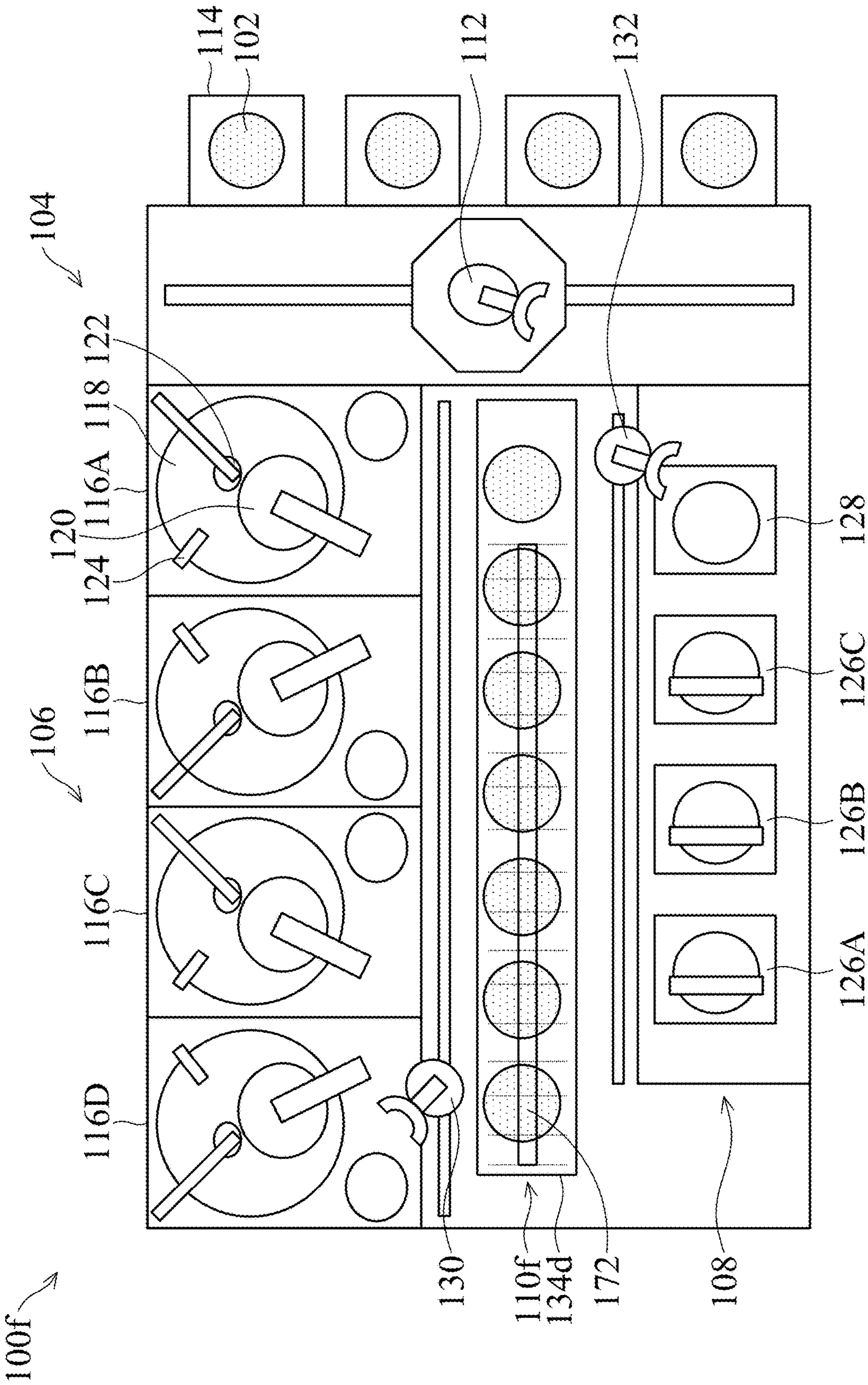
FIG. 10A is a schematic block diagram of a CMP tool in accordance with some embodiments of the present disclosure.
Figure 10B:
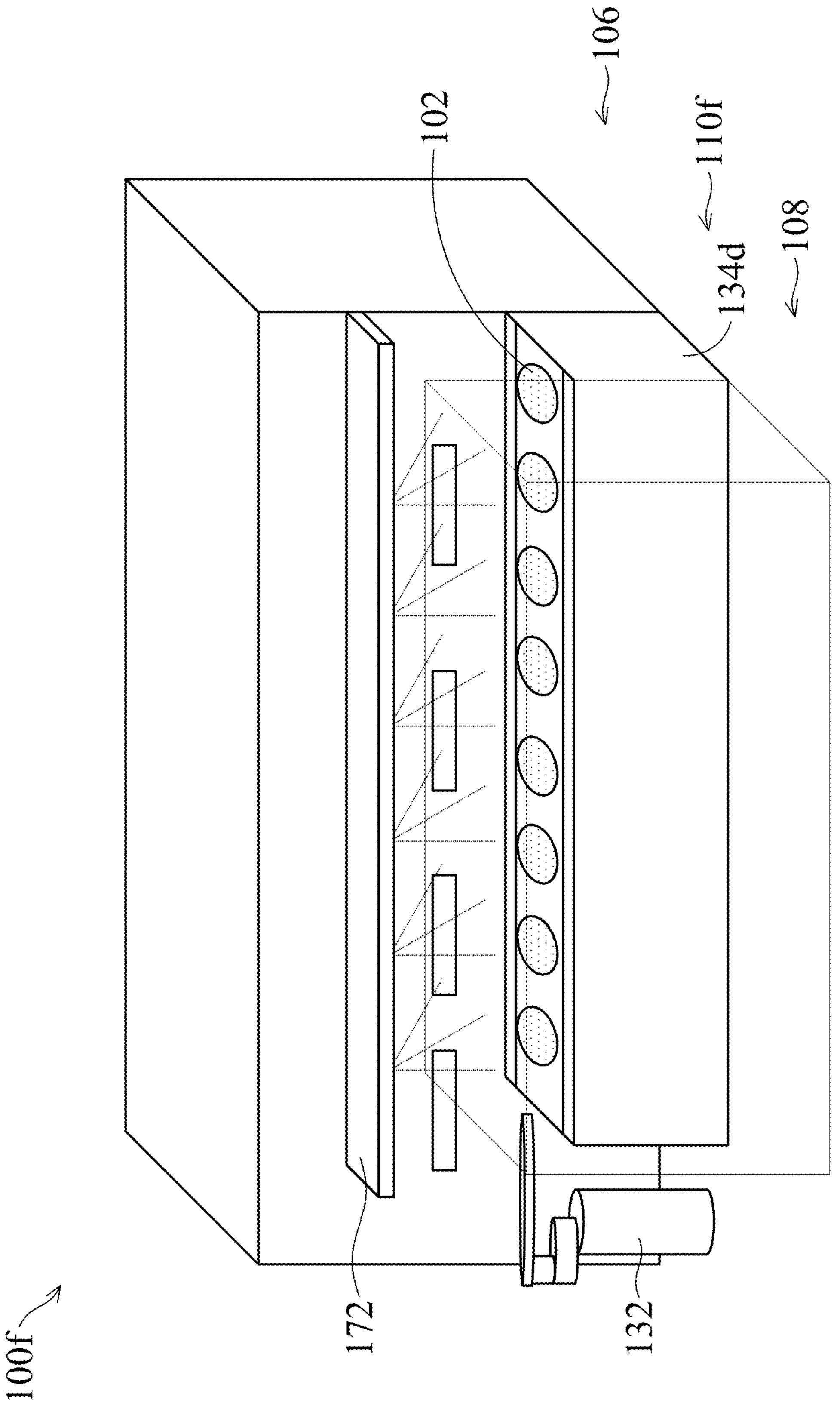
FIG. 10B is a schematic partial perspective view of the CMP tool of FIG. 10A.

FIG. 10A is a schematic block diagram of a CMP tool 100*f* in accordance with some embodiments of the present disclosure. FIG. 10B is a schematic partial perspective view of the CMP tool 100*f*. The CMP tool 100*f* is similar to the CMP tool 100*d* except that the CMP tool 100*f* uses a shower head 172 in place of the one or more spraying nozzle 170.

The shower head 172 may be disposed over the transporter 134*d* to evenly distribute the wetting solution on the substrates 102.

Figure 11:
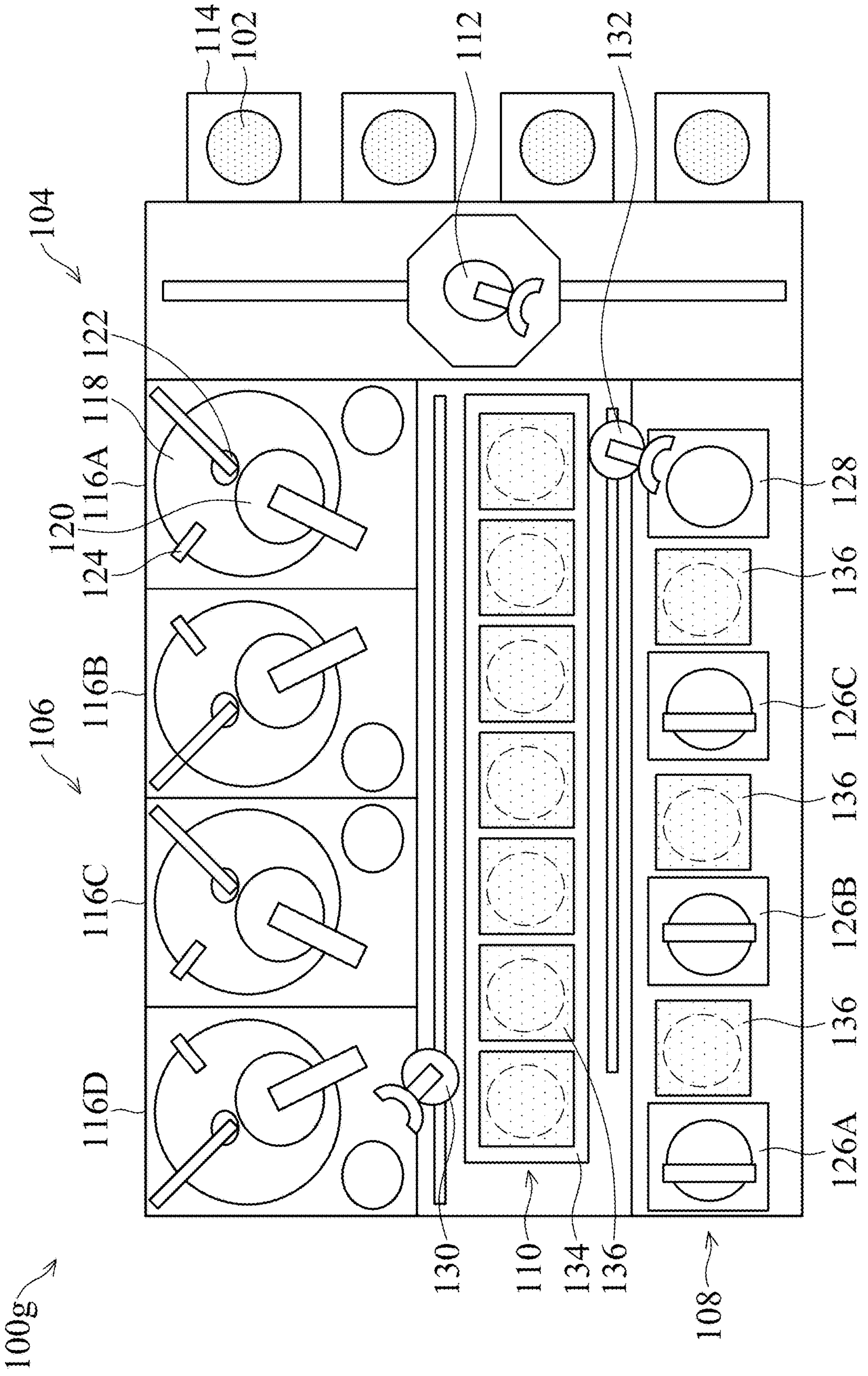
FIG. 11 is a schematic block diagram of a CMP tool in accordance with some embodiments of the present disclosure.

FIG. 11 is a schematic block diagram of a CMP tool 100*g* in accordance with some embodiments of the present disclosure. The CMP tool 100*g* is similar to the CMP tool 100 except that the CMP tool 100*g* includes one or more wet substrate carrier 136 in the cleaning module 108. For example, a wet substrate carrier 136 may be disposed between cleaning stations 126A, 126B, 126C and the drying station 128. The wet substrate carriers 136 dedicated in the cleaning module 108 may prevent cross contamination among substrates at different stages of processing, thus further reducing defects.

Figure 12:
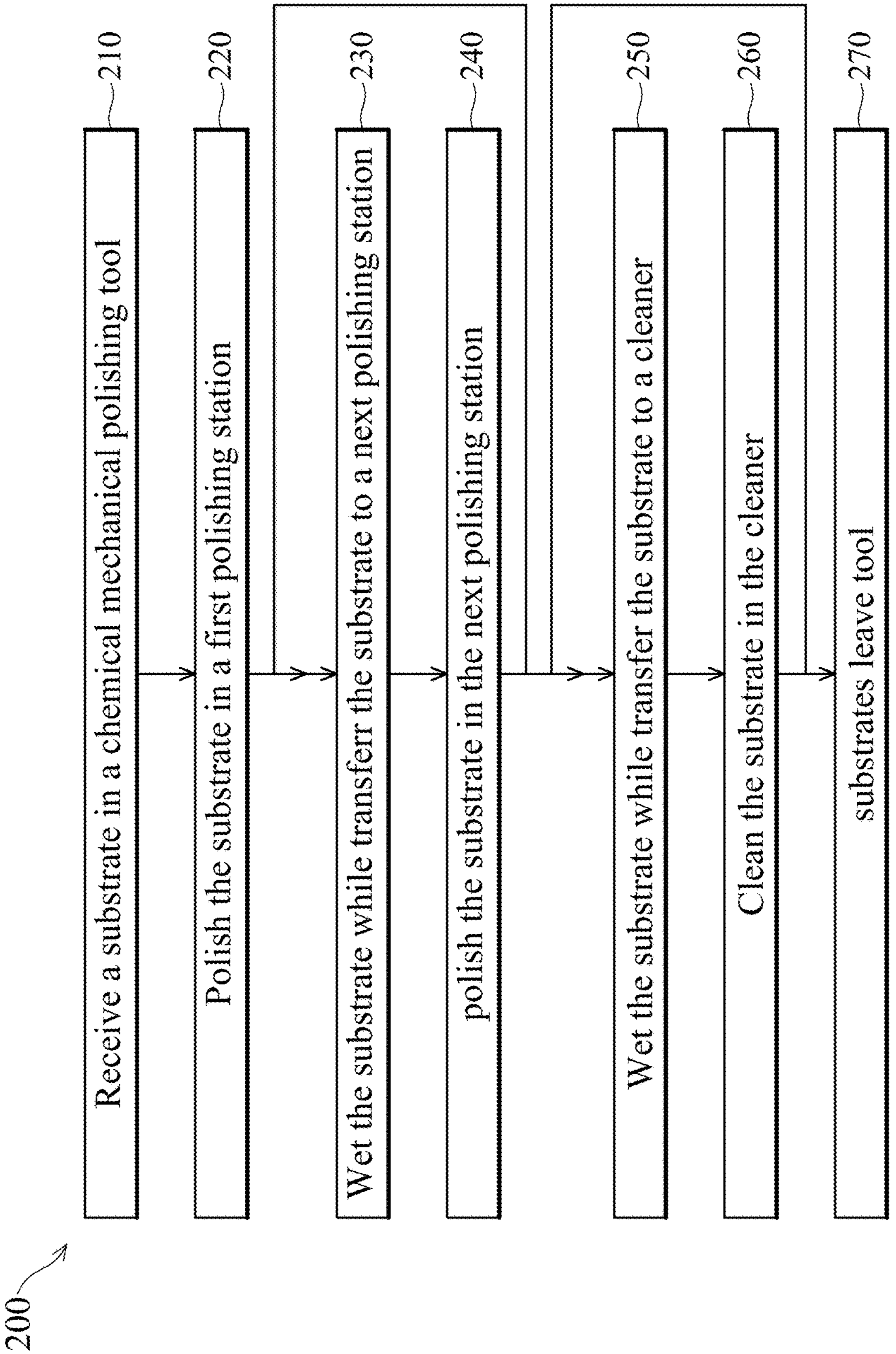
FIG. 12 is a flow chart of a method for processing substrates according to embodiments of the present disclosure.
Figure 13:
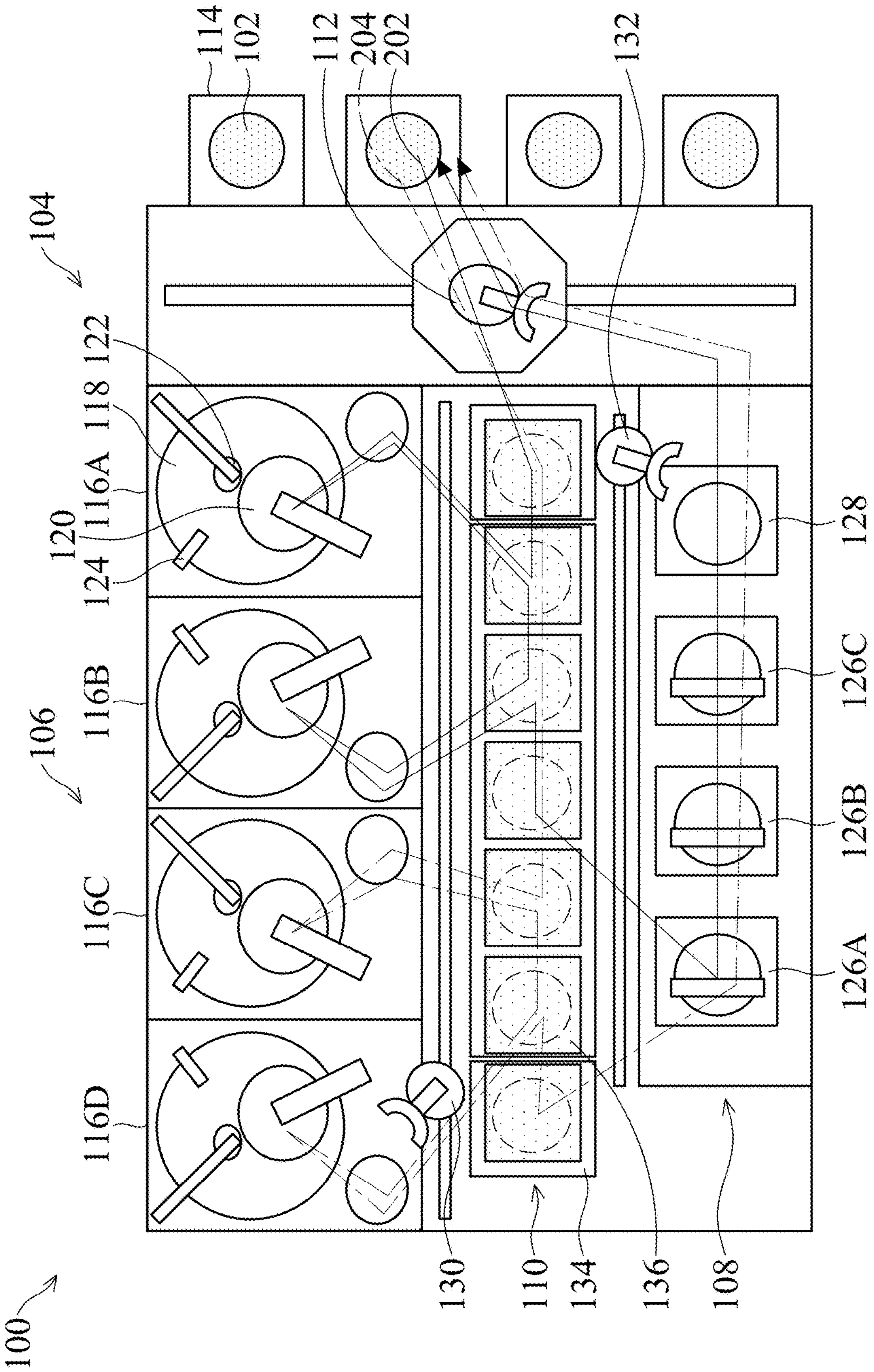
FIG. 13 demonstrates exemplary substrate paths in a CMP tool while in accordance with some embodiments of the present disclosure.

FIG. 12 is a flow chart of a method 200 for processing substrates according to embodiments of the present disclosure. The method 200 is directed to planarizing a substrate by chemical mechanical polishing. Particularly, the method 200 includes operations to prevent the substrates from drying out during transferring and idle time to reduce defects. The method 200 may be performed using any of the CMP tools 100, 100*a*, 100*b*, 100*c*, 100*d*, 100*e*, 100*f*, and 100*g* described above. The method 200 is described below in association with the CMP tool 100 as an example. FIG. 13 is a schematic plan view of the CMP tool 100 showing exemplary paths 202, 204 of substrates being processed using the method 200. Paths 202, 204 are parallel paths. A substrate entering the CMP tool 100 may follow either path 202 or path 204.

At operation 210, a substrate enters a CMP tool, such as the CMP tool 100, to be processed. For example, as shown in FIG. 13, the substrate 102 enters the CMP tool 100 through one of the FOUP 114. The substrate 102 may be transferred from the FOUP 114 through the factory interface 104 by the interface robot 112 to the wet substrate carrier 136 in the transfer module 110. In some embodiments, the substrate 102 moves continuously with the wet substrate carrier 136 in the transfer module 110. In some embodiments, the substrate 102 may be immersed in a wetting bath in the wet substrate carrier 136. Alternatively, the substrate 102, not yet polished, may be placed in a carrier without a wetting solution and remain dry prior to the first polishing operation.

At operation 220, the substrate is polished in a first polishing station for a first polish, such as a rough polish. For example, as shown in FIG. 13, the substrate 102 is transferred to the first polishing station 116A for the first polish. The robot 130 may pick up the substrate 102, which is placed with a device surface 102*f* facing up in the wet substrate carrier 136, transfer the substrate 102 to the first polishing station 116A, and flip the substrate 102 over so that the device surface 102*f* is facing down to load on the carrier head 120. The carrier head 120 moves over to the platen 118 and polish the device surface 102*f* of the substrate 102 against the polishing pad on the platen 118.

At operation 230, the substrate is transferred from the current polishing station to a subsequent polishing station while provided with a wetting solution. For example, as shown in FIG. 13, the substrate 102 is unloaded from the carrier head 120, flipped over with the device surface 102*f* facing up, transferred from the first polishing station 116A to one of the wet substrate carriers 136, and immersed in the wetting solution 148 in the wet substrate carriers 136. In some embodiments, the substrate 102 is returned to the same wet substrate carriers 136 which is moved continuously along the transporter 134 towards the subsequent polishing station. Because the device surface 102*f* is immersed in the wetting solution 148, the device surface 102*f* is not dried up. Byproducts from the first polish, agglomerated abrasives, pad debris, slurry residues, and other particles are unlikely to stick on the device surface 102*f* when the device surface 102*f* remains wet. In some embodiments, flow streams are generated in the wet substrate carrier 136 across the device surface 102*f* to rinse the particles off the device surface 102*f*. In some embodiments, one or more additives, such as surfactant, photocatalyst, CO2, or ozone, may be added to the wetting solution 148. The additive may alter surface property of areas of the device surface 102*f* hydrophilic, further preventing any particles, particularly hydrophobic particles from sticking to the device surface 102*f*.

In other embodiments, when the wet substrate carriers 136 are not used, such as in the CMP tools 100*d* and 100*e*, the substrate may be placed on the transporter 134 with the device surface 102*f* facing up and a wetting solution is the sprayed on the device surface 102*f* to prevent the substrate from drying out. In some embodiments, the wetting solution may be sprayed continuously. In other embodiments, the wetting solution is sprayed periodically.

The substrate 102 remains in the wet substrate carrier 136 or the transporter 134 with spraying nozzles until the subsequent polishing station is available. The robot 130 may be used to transfer the substrate 102 at operation 230. When the polishing station for the subsequent polish is ready, the robot 130 may pick up the substrate 102 from the wetting solution 148 in the wet substrate carrier 136, or directly from the transporter, and transfer the substrate 102 to the subsequent polishing station.

At operation 240, the substrate is polished in a subsequent polishing station for a subsequent polish, such as a fin polish. For example, as shown in FIG. 13, the substrate 102 is transferred to the second polishing station 116B for the second polish. The robot 130 picks up the substrate 102 from the wetting solution 148 in the wet substrate carrier 136, transfer the substrate 102 to the second polishing station 116B, and flip the substrate 102 over so that the device surface 102*f* is facing down to load on the carrier head 120. The carrier head 120 then moves over to the platen 118 and polish the device surface 102*f* of the substrate 102 against the polishing pad on the platen 118.

For CMP sequence with more than two polishing steps, operations 230 and 240 may be repeated until all polishing steps are completed.

At operation 250, upon completing all polishing steps, the substrate is transferred from the polish module of the CMP tool to the cleaning module of the CMP tool while provided with a wetting solution. For example, as shown in FIG. 13, the substrate 102 is unloaded from the carrier head 120, flipped over with the device surface 102*f* facing up, transferred from the polishing module 106 to one of the wet substrate carriers 136, and immersed in the wetting solution 148 in the wet substrate carriers 136. In some embodiments, the substrate 102 is returned to the same wet substrate carriers 136 which is moved continuously along the transporter 134 towards the cleaning module 108. Similar to at operation 230, the wetting solution 148 reduces defects caused by byproducts from the first polish, agglomerated abrasives, pad debris, slurry residues, and other particles. In other embodiments, when the wet substrate carriers 136 are not used, such as in the CMP tools 100*d* and 100*e*, the substrate 102 may be placed on the transporter 134 with the device surface 102*f* facing up and a wetting solution is the sprayed on the device surface 102*f* to prevent the substrate from drying out. The robot 130 may be used to transfer the substrate 102 from the polishing module 106 to the transfer module 110.

The substrate 102 remains in the wet substrate carrier 136 or the transporter 134 with spraying nozzles until the cleaning module is available. When a cleaning station in the cleaning module is ready, the robot 132 may pick up the substrate 102 from the wetting solution 148 in the wet substrate carrier 136, or directly from the transporter 134, and transfer the substrate 102 to the cleaning module 108.

At operation 260, post-polish cleaning is performed. As shown in FIG. 13, the polished substrate is retrieved from the wetting solution 148 in the wet substrate carrier 136, or directly from the transporter 134, and transferred into the cleaning stations 126A, 126B, 126C sequentially to be cleaned. In some embodiments, the cleaning station 126A is a megasonic cleaning station configured to dislodge contaminants from the substrate using a megasonic energy applied to the cleaning solution to agitate the cleaning solution. The cleaning station 126B is scrub cleaning station, where the substrate 102 is scrubbed by cleaning pads as a cleaning solution is sprayed on the substrate 102, thereby removing contaminants from surfaces of the substrate 102. The cleaning station 126C is a brush cleaning station, where the substrate 102 is scrubbed by respective cleaning brushes as a cleaning solution is sprayed to the substrate 102, thereby removing contaminants from surfaces of the substrate 102. The drying station 128 is configured to rinse and dry the substrate 102 by deionized water and isopropyl alcohol (IPA).

In some embodiments, the substrate 102 are cleaned by sequentially moving through the cleaning stations 126A, 126B, 126C, and the drying station 128 without leaving the cleaning module 108, as shown in the paths 202, 204 in FIG. 13. In other embodiments, the substrate 102 may be transferred to the transfer module 110 during wait time between the cleaning steps to prevent the substrate from drying out during waiting. In that situation, operations 250, 260 are performed repeatedly for each cleaning operation. In some embodiments, wet substrate carriers 136 may be disposed between the cleaning stations 126A, 126B, 126C, and the drying station 128, as in the CMP tool 100*g*, and the substrate 102 is retained in the wet substrate carriers 136 within the cleaning module 108.

In some embodiments, one or more post polish cleaning process may be omitted because using the wetting solution in the transfer module effectively reduces contaminants on the polished substrate. In some embodiments, the megasonic cleaning process may be omitted from the post polish cleaning.

At operation 270, after cleaning, the substrate exits the CMP tool. In the example of FIG. 13, the substrate 102 may exit the cleaning module 108 from the drying station without going through the transfer module 110. The interface robot 112 in the factory interface may retrieve the substrate 102 from the drying station 128 and returns to one of the FOUP 114.

Embodiments of the present disclosure improves yield, particularly when substrates being polished including hydrophobic materials. FIGS. 14A-14B, 15A-15B, and 16A-16B schematically illustrate a semiconductor device 300 during fabrication at various stage of processing. A CMP process according to the present disclosure is performed when fabricating the semiconductor device 300 with reduced defects. FIGS. 14A-16A are schematic partial perspective views of the semiconductor device 300. FIGS. 14B-16B are schematic sectional views of the semiconductor device 300.

Figure 14B:
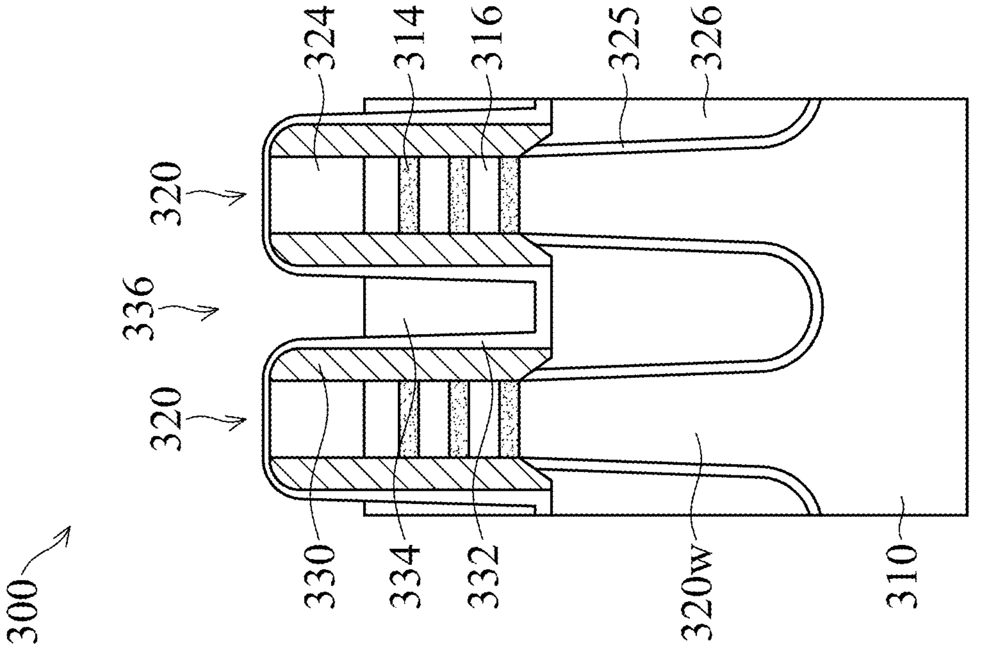
FIGS. 14A-14B, 15A-15B, and 16A-16B schematically illustrate a semiconductor device during fabrication at various stage of processing.
Figure 14A:
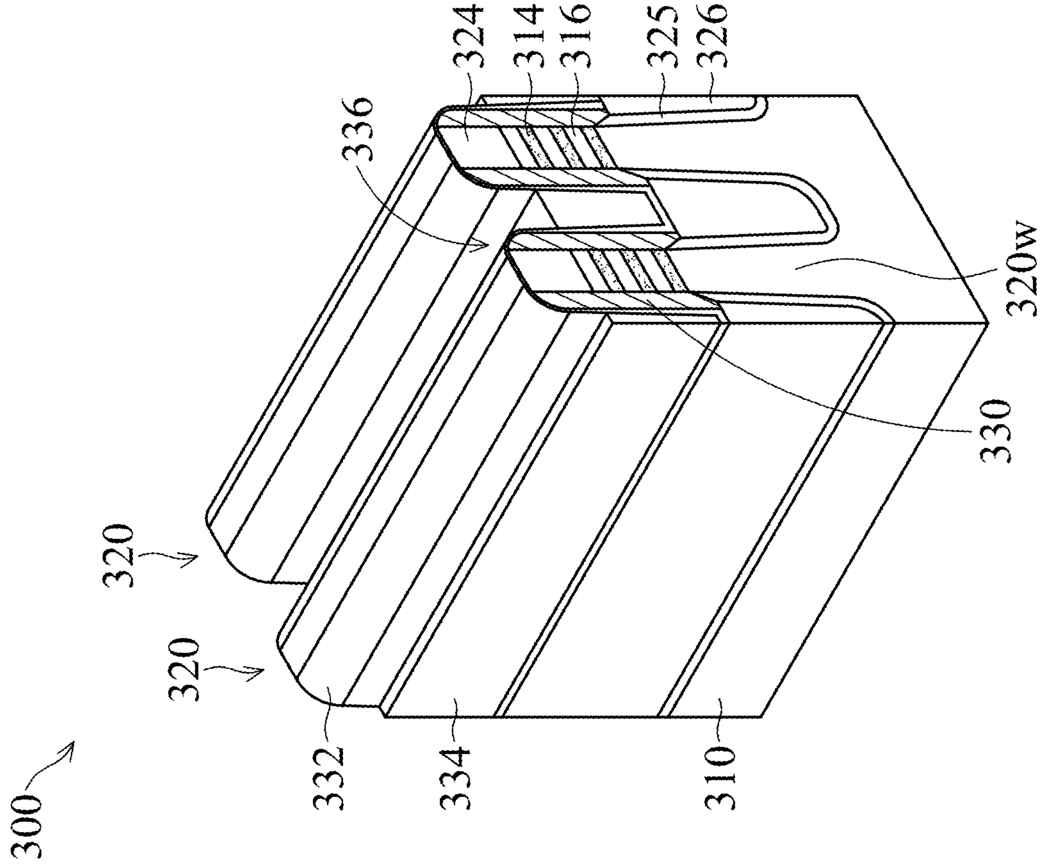

In FIGS. 14A-14B, the semiconductor device 300 includes semiconductor fin 320 for gate all around (GAA) transistors. The semiconductor device 300 are formed in or on a substrate 310. The substrate 310 may include a single crystalline semiconductor material such as, but not limited to Si, Ge, SiGe, GaAs, InSb, GaP, GaSb, InAlAs, InGaAs, GaSbP, GaAsSb, and InP. The semiconductor fins 320 extend from the substrate 310. Each semiconductor fin 320 includes a well portion 320*w* formed from the substrate 310, and two or more semiconductor layers 314, 316 alternatively stacked over the well portion 320*w*.

The semiconductor layer 314 is eventually removed with replacement gate structure. Portions of the semiconductor layer 316 become channel in the final device. In some embodiments, the semiconductor layer 314 may include silicon germanium (SiGe). The semiconductor layer 316 may include Si, Ge, a compound semiconductor such as SiC, GeAs, GaP, InP, InAs, and/or InSb, an alloy semiconductor such as SiGe, GaAsP, AlInAs, AlGaAs, InGaAs, GaInP, and/or GaInAsP, or combinations thereof.

A mask layer 324 is disposed over the semiconductor fins 320. The mask layer 324 is used during the patterning process as of the semiconductor fins 320. The mask layer 324 may include any suitable material that provide an etch selectivity with the semiconductor layers 314, 316, and the substrate 310. In some embodiments, the mask layer 324 include silicon oxide.

An isolation layer 326 is formed in the trenches between the semiconductor fins 320. The isolation layer 326 cover at least a part of the well portions 320*w* of the semiconductor fins 320. The isolation layer 326 may include silicon oxide, silicon nitride, silicon oxynitride, fluorine-doped silicate glass (FSG), a low-k dielectric, combinations thereof. In some embodiments, a liner 325 may be formed between the isolation layer 326 and the semiconductor fins 320. In some embodiments, the liner 325 and the isolation layer 326 are deposited to cover the semiconductor fins 320 by a suitable deposition process to fill the trenches between the semiconductor fins 320, and then recess etched using a suitable anisotropic etching process to exposed the semiconductor layers 314, 316 of the semiconductor fins 320.

A cladding layer 330 is formed on sidewalls of the semiconductor fins 320. In some embodiments, the cladding layer 330 includes a semiconductor material, for example SiGe. Hybrid fins 336 are then formed in the trenches between the semiconductor fins 320 between the cladding layer 330. In FIGS. 14A-14B, the hybrid fins 336 are bi-layer structures including a dielectric liner layer 332 and a dielectric filling layer 334. In some embodiments, the dielectric liner layer 332 may include a low-k material, such as SiONC, SiCN, SiOC, or other dielectric material, that provide etch resistance during replacement gate processes. The dielectric filling layer 334 may be a low-k dielectric material, such as silicon oxide. The dielectric filling layer 334 may be deposited and then recess etched back to a desired level as shown in FIGS. 14A-14B. In some embodiments, the dielectric filling layer 334 are substantially at the same level as a top surface of the topmost semiconductor layer 316.

Figure 15A:
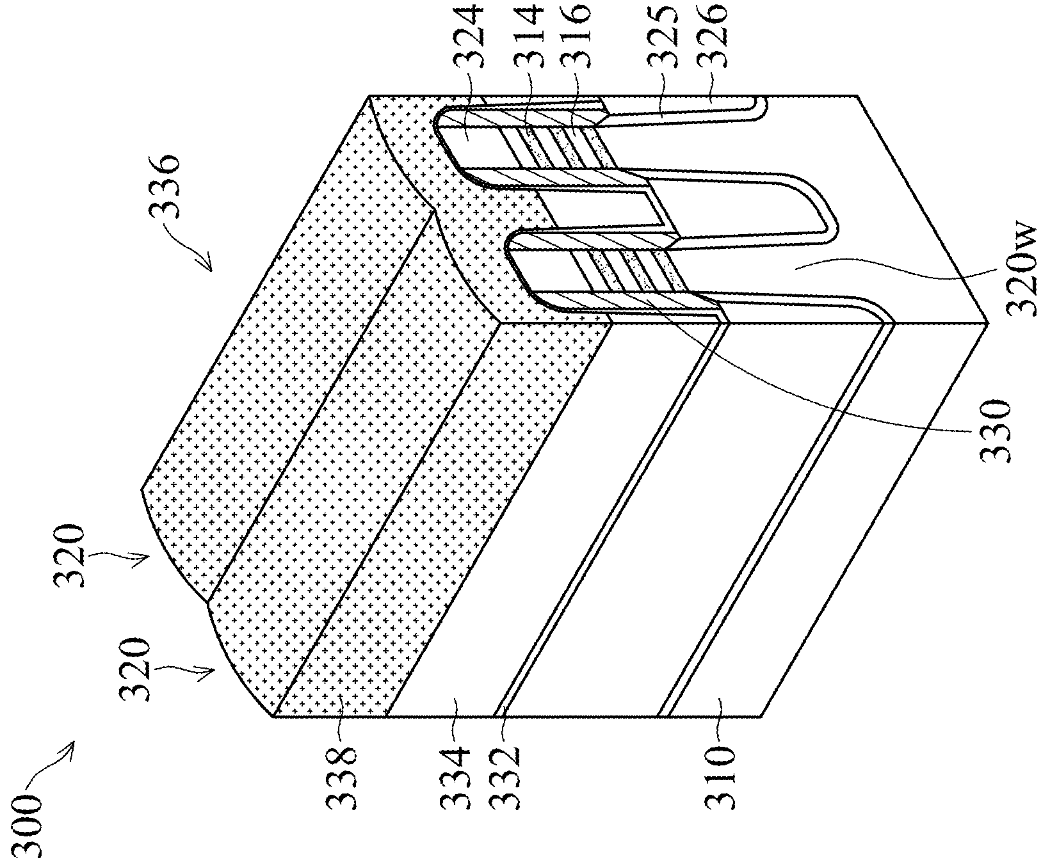
Figure 15B:
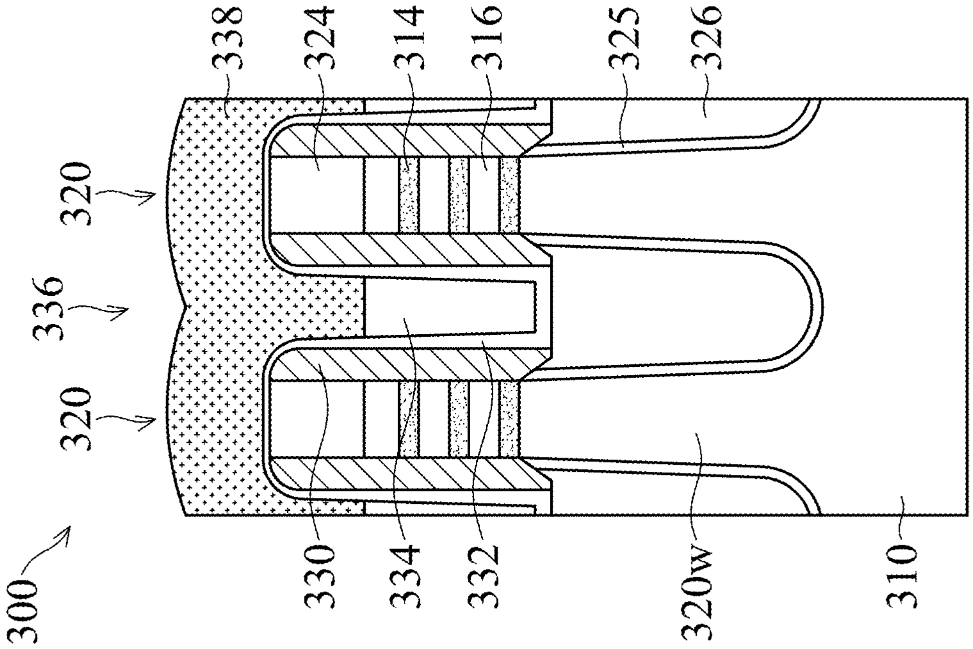

In FIGS. 15A-15B, a high-k dielectric layer 338 is formed by a blanket deposition. The high-k dielectric layer 338 may include a material having a k value greater than 7, such as $HfO_2$, $ZrO_2$, HfAlOx, HfSiOx, or $Al_2O_3$. Any suitable deposition process, such as a CVD, PECVD, FCVD, or ALD process, may be used to deposit the high-k dielectric material.

Figure 16B:
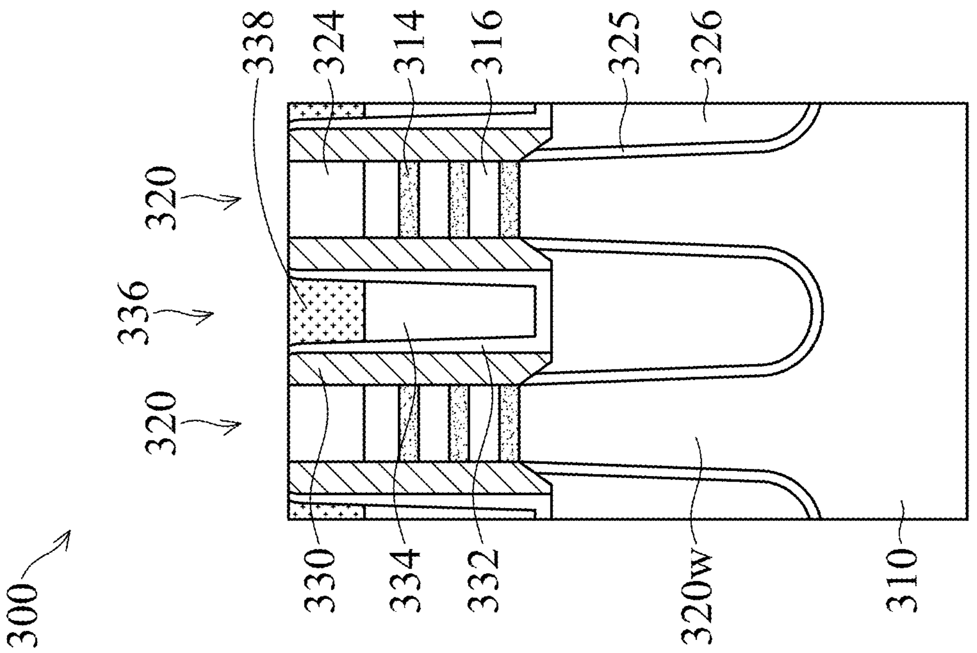
Figure 16A:
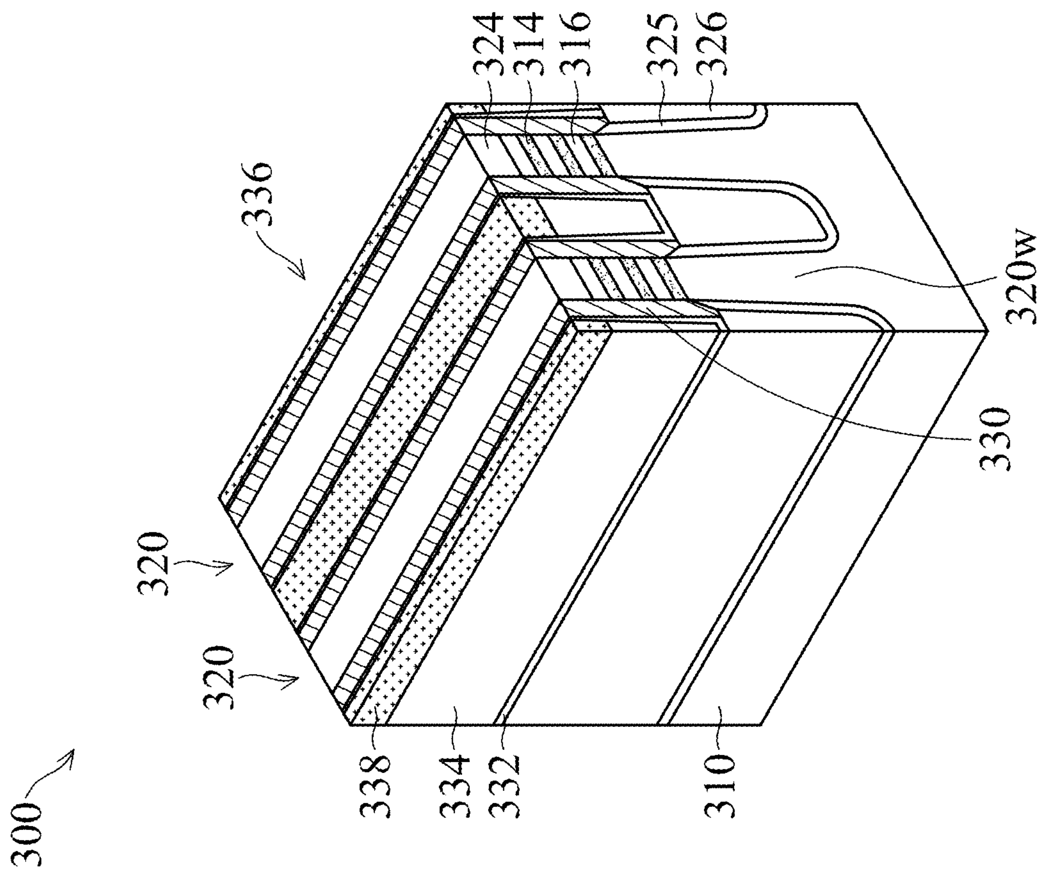

In FIGS. 16A-16B, after formation of the high-k dielectric layer 338, a planarization is performed to expose the hard mask layer 324 resulting in a top surface including areas of the high-k dielectric layer 338, the cladding layer 330, the hard mask layer 324, and the dielectric liner layer 332. Because particles of the high-k material in the high-k dielectric layer 338 are hydrophobic and are easily attracted to other surface areas of silicon oxide, e.g. the hard mask layer 324, or surface areas of semiconductors, e.g. the cladding layer 330, the particles of high-k material increase defects on the substrate being polished. The defects can be reduced using the method and/or CMP tools according to the present disclosure. Particularly, particle contamination is reduced by keeping the substrate surface wet in the polishing tool. For example, immersing the substrate in a wetting solution or spraying the substrate with a wetting solution during substrate transfer or idle time. The wetting solution may be deionized water. In some embodiments, the wetting solution may be deionized water with one or more additives, such as a surfactant, a photocatalyst, carbon dioxide, and ozone.

Various embodiments or examples described herein offer multiple advantages over the state-of-art technology. Embodiments of the present disclosure reduce particle contamination during CMP process by keeping substrates wet during substrate transfer and idle time to prevent particles from sticking onto the substrate. The reduced contamination results in a major improvement of yield. Embodiments of the present disclosure may be retrofitted to existing CMP tools, thus, provide a low-cost improvement. Additionally, wetting the substrate during polishing reduces burden of post-polishing cleaning, thus, improving process efficiency.

It will be understood that not all advantages have been necessarily discussed herein, no particular advantage is required for all embodiments or examples, and other embodiments or examples may offer different advantages.

Some embodiments of the present provide a method. The method comprises loading a substrate through a factory interface into a CMP (chemical mechanical polishing) tool comprising a polishing module, a cleaning module, and a transfer module; polishing the substrate in the polishing module; transferring the substrate from the polishing module to a substrate carrier in the transfer module; immersing the substrate in a wetting solution retained in the substrate carrier; transferring the substrate from the substrate carrier to the polishing module; cleaning the substrate in the polishing module; and unloading the substrate from the CMP tool through the factory interface.

Some embodiments of the present disclosure provide a method. The method comprises loading a substrate to a polishing tool comprising: a polishing module; a cleaning module; and a transfer module operable to transfer substrates from the polishing module to the cleaning module, wherein the transfer module comprises a substrate wetting device; polishing a device surface of the substrate in a first polishing operation of the polishing module; transferring the substrate from the first polishing station to the substrate wetting device and covering the device surface with a wetting solution; transferring the substrate from the substrate wetting device to a first cleaning station in the cleaning module; and cleaning the substrate with in the first cleaning station.

Some embodiments of the present disclosure provide a method. The method comprises loading a substrate to a CMP tool; performing a first polish on a device surface of the substrate in a first polishing station; transferring the substrate from the first polishing station to a transporter; providing a wetting solution to the device surface of the substrate after the first polish of the substrate while the substrate is disposed in the transporter; transferring the substrate from the transporter to a second polishing station; performing a second polish on the device surface of the substrate in the second polishing station; transferring the substrate from the second polishing station to the transporter; providing the wetting solution to the device surface after the second polish of while the substrate is disposed in the transporter; and cleaning the substrate after the second polish in a first cleaning station.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

loading a substrate to a CMP tool;

performing a first polish on a device surface of the substrate in a first polishing station;

transferring the substrate from the first polishing station to a transporter;

providing a wetting solution to the device surface of the substrate after the first polish of the substrate while the substrate is disposed in the transporter;

transferring the substrate from the transporter to a second polishing station;

performing a second polish on the device surface of the substrate in the second polishing station;

transferring the substrate from the second polishing station to the transporter;

providing the wetting solution to the device surface after the second polish of while the substrate is disposed in the transporter; and cleaning the substrate after the second polish in a first cleaning station, wherein providing the wetting solution comprises spraying the substrate being transferred by the transporter with the wetting solution, and spraying the substrate being transferred by the transporter with the wetting solution comprises injecting flow streams of the wetting solution across the substrate in a substrate carrier.

2. The method of claim 1, wherein spraying the substrate comprises spraying the substrate with one or more spraying nozzles.

3. The method of claim 2, wherein the one or more nozzles are disposed in the substrate carrier.

4. The method of claim 1, wherein providing the wetting solution changes hydrophobic areas on the substrate surface to hydrophilic.

5. The method of claim 4, wherein the wetting solution comprises deionized water, and one or more additives to make a surface of the substrate hydrophilic.

6. The method of claim 1, wherein the substrate carrier is disposed on the transporter.

7. The method of claim 6, further comprising immersing the substrate in the wetting solution retained in the substrate carrier.

8. A method, comprising:

loading a substrate to a polishing tool comprising:

a polishing module;

a cleaning module; and a transfer module operable to transfer substrates from the polishing module to the cleaning module, wherein the transfer module comprises a substrate wetting device;

polishing a device surface of the substrate in a first polishing operation of the polishing module;

transferring the substrate from the first polishing station to the substrate wetting device and covering the device surface with a wetting solution;

transferring the substrate from the substrate wetting device to a first cleaning station in the cleaning module; and cleaning the substrate with in the first cleaning station, wherein the substrate wetting device comprises a conveyor belt and one or more nozzles, and transferring the substrate comprises:

continuously moving the substrate along the conveyor belt; and spraying the wetting solution to the device surface of the substrate while the substrate is moving on the conveyor belt.

9. The method of claim 8, wherein the one or more nozzles are stationarily disposed along the conveyor belt.

10. The method of claim 8, wherein the substrate wetting device comprises:

a wet substrate carrier having an inner volume for retaining a wetting bath of a wetting solution, and the one or more nozzles are injects disposed in the wet substrate carrier and configured to spray the wetting solution.

11. The method of claim 10, further comprising covering the device surface comprises immersing the substrate in the wetting bath.

12. The method of claim 11, further comprising:

continuously moving the wet substrate carrier along the conveyor belt.

13. The method of claim 11, wherein the injects spray flow streams along a direction substantially parallel to a moving direction of the conveyor.

14. The method of claim 11, wherein the injects spray flow streams along a direction substantially perpendicular to a moving direction of the conveyor.

15. A method, comprising:

loading a substrate through a factory interface into a CMP (chemical mechanical polishing) tool comprising a polishing module, a cleaning module, and a transfer module;

polishing the substrate in the polishing module;

transferring the substrate from the polishing module to the transfer module;

exposing the substrate on the transfer module to a wetting solution comprising:

continuously moving the substrate along a conveyor belt; and spraying the wetting solution to the substrate while the substrate is moving on the conveyor belt;

cleaning the substrate in the cleaning module; and unloading the substrate from the CMP tool through the factory interface.

16. The method of claim 15, wherein the conveyor belt is disposed between the polishing module and the cleaning module.

17. The method of claim 15, wherein the wetting solution comprises deionized water, and one or more additives to make a surface of the substrate hydrophilic.

18. The method of claim 15, wherein spraying the wetting solution comprises spraying the substrate with the wetting solution using one or more nozzles.

19. The method of claim 15, wherein exposing the substrate to the wetting solution comprises immersing the substrate in a substrate carrier having an inner volume for retaining a bath of the wetting solution.

20. The method of claim 18, wherein the one or more nozzles are disposed in a substrate carrier.

* * * * *